(12) United States Patent
Seki et al.

(10) Patent No.: US 11,509,034 B2
(45) Date of Patent: Nov. 22, 2022

(54) DIRECTIONAL COUPLER

(71) Applicant: Murata Manufacturing Co., Ltd., Nagaokakyo (JP)

(72) Inventors: Kenta Seki, Nagaokakyo (JP); Yasushi Shigeno, Nagaokakyo (JP); Daisuke Tokuda, Nagaokakyo (JP); Ryangsu Kim, Nagaokakyo (JP); Katsuya Shimizu, Nagaokakyo (JP); Kazuhito Osawa, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 4 days.

(21) Appl. No.: 16/941,577

(22) Filed: Jul. 29, 2020

(65) Prior Publication Data
US 2021/0036395 A1    Feb. 4, 2021

Related U.S. Application Data

(60) Provisional application No. 62/882,095, filed on Aug. 2, 2019.

(51) Int. Cl.
*H01P 5/18*   (2006.01)
*H03H 7/01*   (2006.01)
*H01G 4/40*   (2006.01)
*H04B 1/04*   (2006.01)

(52) U.S. Cl.
CPC ............... *H01P 5/18* (2013.01); *H01G 4/40* (2013.01); *H03H 7/0115* (2013.01); *H04B 1/04* (2013.01)

(58) Field of Classification Search
CPC .............................. H01P 5/18; H03H 7/0115
USPC ................................................. 333/111, 175
See application file for complete search history.

(56) References Cited

U.S. PATENT DOCUMENTS 10,498,004 B1 * 12/2019 Ji ............................ H03H 7/38
2014/0015568 A1 * 1/2014 Shimamune ............ H03F 3/195
                                                                    327/103

FOREIGN PATENT DOCUMENTS

JP    2009-027617 A    2/2009

* cited by examiner

*Primary Examiner* — Rakesh B Patel
(74) *Attorney, Agent, or Firm* — Keating & Bennett, LLP

(57) ABSTRACT

A directional coupler includes a main line through which a signal is transmitted, first and second sub-lines that are selectively coupled to the main line, and a common output port that outputs a detection signal generated by the signal transmitted through the main line, wherein a first degree of coupling between the main line and the first sub-line is different than a second degree of coupling between the main line and the second sub-line.

17 Claims, 13 Drawing Sheets

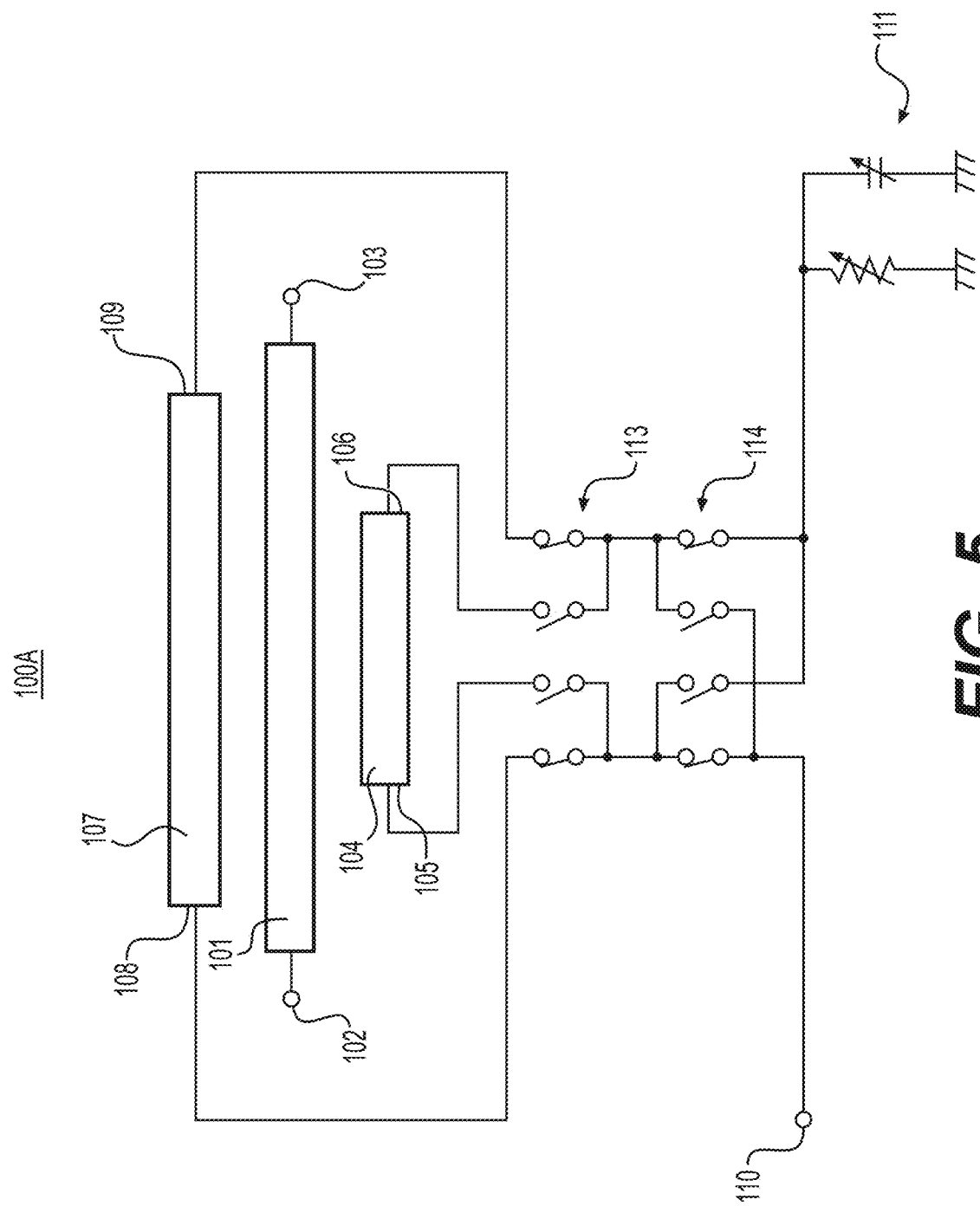

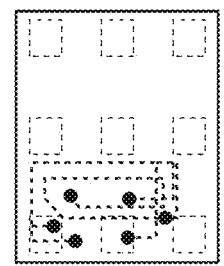
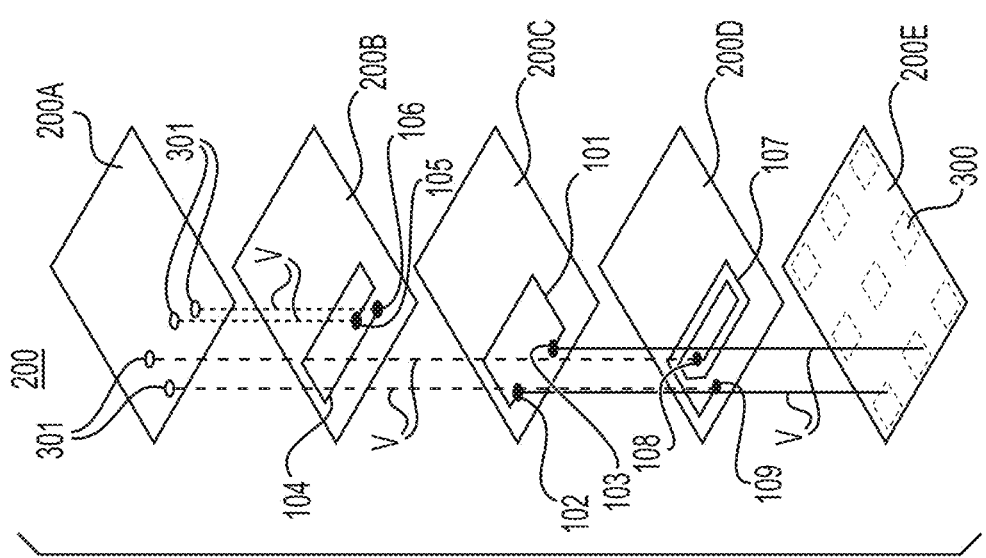
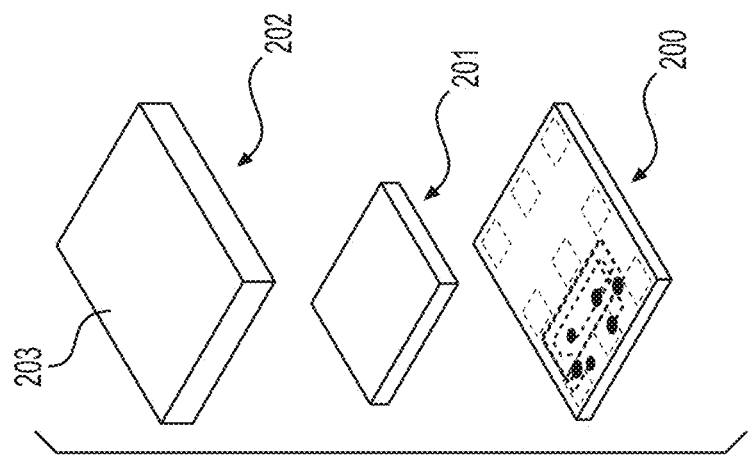
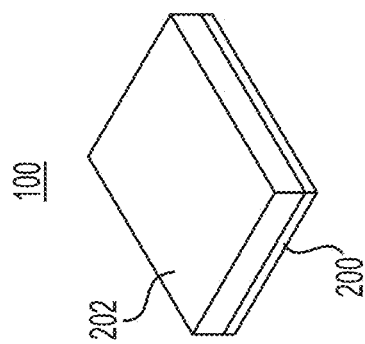

DIRECTIONAL COUPLER

BACKGROUND OF THE INVENTION

1. Field of the Invention

The present invention relates to directional couplers. More specifically, the present invention relates to directional couplers including at least two sub-lines.

2. Description of the Related Art

In high-frequency devices, a directional coupler extracts a portion of a high-frequency signal to measure characteristics of the high-frequency signal. In a directional coupler having a typical structure, a main line connected between an input terminal and an output terminal and a sub-line connected between a coupling terminal and a termination terminal are in parallel with each other, and a portion of the high-frequency signal flowing through the main line is extracted by the sub-line.

As shown in FIG. 1, a known bidirectional coupler 1 includes a main line 2 and a single sub-line 3. The sub-line 3 is connected to an output port 5 and a termination circuit 6. A switch circuit 4 selectively connects one end of the sub-line 3 to either the output port 5 or the termination circuit 6 and selectively connects the other end of the sub-line 3 to either the termination circuit 6 or the output port 5.

Japanese Unexamined Patent Application Publication No. 2009-27617 discloses a directional coupler including a main line that propagates a high frequency signal from an input terminal to an output terminal, and a sub-line that is electromagnetically coupled to the main line. One end of the sub-line is connected to a detection terminal and the other end of the sub-line is connected to a terminal resistor that removes an undesirable signal, such as a reflected wave.

The directional coupler disclosed in Japanese Unexamined Patent Application Publication No. 2009-27617 suffers from a problem in that, when the directional coupler is operated over a wide frequency band, the insertion loss is excessively increased as the frequency increases. More specifically, because the degree of coupling between the main line and the sub-line is fixed at a specific value and because the direction in which the signal is transmitted in the sub-line is fixed, it is difficult to obtain an optimum coupling degree between the main line and the sub-line. For example, when a desired coupling degree is obtained at a low frequency, the coupling degree becomes excessively high at a high frequency, which results in an unnecessarily high insertion loss.

SUMMARY OF THE INVENTION

Preferred embodiments of the present invention provide directional couplers that are each able to achieve appropriate coupling at wide frequency bands in which the directional couplers operate, and to reduce or prevent an undesired increase in insertion loss.

A directional coupler according to a preferred embodiment of the present invention includes a main line through which a signal is transmitted; at least two sub-lines that are selectively coupled to the main line; a common output port that outputs a detection signal generated by the signal transmitted through the main line; a termination circuit; and at least one switch circuit that: selectively connects one of the at least two sub-lines to the common output port and the termination circuit, selectively disconnects another one of the at least two sub-lines from the common output port and the termination circuit, and selectively connects one end of the one of the at least two sub-lines to one of the common output port and the termination circuit and another end of the one of the at least two sub-lines to another one of the termination circuit and the common output port; wherein a degree of coupling between the main line and one of the at least two sub-lines is different from a degree of coupling between the main line and another one of the at least two sub-lines.

In a directional coupler according to a preferred embodiment of the present invention, the at least one switch circuit includes a series switch connected between at least one of the at least two sub-lines and the common output port, and a shunt switch connected between the at least one of the at least two sub-lines and ground.

In a directional coupler according to a preferred embodiment of the present invention, the at least one switch circuit includes first and second switch circuits; the first switch circuit selectively connects the one end of the one of the at least two sub-lines to the one of the common output port and the termination circuit and the another end of the one of the at least two sub-lines to the another one of the termination circuit and the common output port; and the second switch circuit selectively connects the one of the at least two sub-lines to the common output port and the termination circuit and disconnects the another one of the at least one sub-lines from the common output port and the termination circuit.

In a directional coupler according to a preferred embodiment of the present invention, the first and second switch circuits are separate switch circuits.

In a directional coupler according to a preferred embodiment of the present invention, a second shunt switch is provided between the first and second switch circuits and connected to ground.

In a directional coupler according to a preferred embodiment of the present invention, at least one of the first and second switch circuits is provided separately for each of the first and second sub-lines.

In a directional coupler according to a preferred embodiment of the present invention, the first and second switch circuits are defined by a common switch circuit.

A directional coupler according to a preferred embodiment of the present invention further includes a third shunt switch between at least one of the at least two sub-lines and the common output terminal and connected to ground, wherein the third shunt switch is open to define an electrostatic discharge device.

In a directional coupler according to a preferred embodiment of the present invention, the termination circuit includes at least two termination circuits that are provided separately for the at least two sub-lines.

A directional coupler according to a preferred embodiment of the present invention further includes first and second electrical length adjustment loading circuits, wherein the at least one switch circuit includes first, second, third switch circuits, and the third switch circuit selectively connects and disconnects the first and second electrical length adjustment loading circuits to the another one of the at least two sub-lines that is disconnected from the common output port and the termination circuit.

In a directional coupler according to a preferred embodiment of the present invention, at least one of the first and second electrical length adjustment loading circuits includes a capacitor connected in series between the third switch circuit and ground.

In a directional coupler according to a preferred embodiment of the present invention, the first switch circuit selectively connects the one end of the one of the at least two sub-lines to the one of the common output port and the termination circuit and the another end of the one of the at least two sub-lines to the another one of the termination circuit and the common output port, the second switch circuit selectively connects the one of the at least two sub-lines to the common output port and the termination circuit and selectively disconnects the another one of the at least one sub-lines from the common output port and the termination circuit, at least one of the first and second electrical length adjustment loading circuits and the third switch are defined by the first switch circuit, the first switch circuit includes a series switch provided between at least one of the at least two sub-lines and the common output port, and a shunt switch provided between the at least one of the two sub-lines and ground, and a capacitance is provided when the series switch which is open.

In a directional coupler according to a preferred embodiment of the present invention, the first switch circuit selectively connects the one end of the one of the at least two sub-lines to the one of the common output port and the termination circuit and the another end of the one of the at least two sub-lines to the another one of the termination circuit and the common output port, the second switch circuit selectively connects the one of the at least two sub-lines to the common output port and the termination circuit and selectively disconnects the another one of the at least one sub-lines from the common output port and the termination circuit, at least one of the first and second electrical length adjustment loading circuits and the third switch are defined by the second switch circuit, the second switch circuit includes a series switch provided between at least one of the at least two sub-lines and the common output port, and a shunt switch provided between the at least one of the two sub-lines and ground, and a capacitance is provided when the series switch which is open.

In a directional coupler according to a preferred embodiment of the present invention, the termination circuit is a variable termination circuit.

A directional coupler according to a preferred embodiment of the present invention further includes a variable matching circuit between at least one of the at least two sub-lines and the common output port, and a variable attenuator between the at least one of the at least two sub-lines and the common output port.

A directional coupler according to a preferred embodiment of the present invention includes a main line through which a signal is transmitted; at least two sub-lines that are selectively coupled to the main line; a common output port that outputs a detection signal generated by the signal transmitted through the main line; a termination circuit; and at least one switch circuit that selectively connects one of the at least two sub-lines to the common output port and the termination circuit, selectively disconnects another one of the at least two sub-lines to the common output port and the termination circuit, and selectively connects one end of the one of the at least two sub-lines to one of the common output port and the termination circuit and another end of the one of the at least two sub-lines to another one of the termination circuit and the common output port; wherein the at least two sub-lines have one or more of different sizes, distances from the main line, or lengths.

A directional coupler according to a preferred embodiment of the present invention includes a main line through which a signal is transmitted; first and second sub-lines that are selectively coupled to the main line; and a common output port that outputs a detection signal generated by the signal transmitted through the main line; wherein a first degree of coupling between the main line and the first sub-line is different than a second degree of coupling between the main line and the second sub-line.

A directional coupler according to a preferred embodiment of the present invention further includes a switch circuit that selects which of the first and second sub-lines is coupled to the main line and that selects which signal-transmission direction of the selected first and second sub-lines.

In a directional coupler according to a preferred embodiment of the present invention, the first sub-line is selected in a first frequency range of the signal transmitted through the main line, and the second sub-line is selected in a second frequency range, different from the first frequency range, of the signal transmitted through the main line.

A directional coupler according to a preferred embodiment of the present invention, further includes a terminal substrate including the main line and the first and second sub-lines, and a semiconductor chip mounted on the terminal substrate.

With preferred embodiments of the present invention, directional couplers can be provided that are each able to achieve appropriate coupling at wide frequency bands in which the directional couplers operate, and to reduce or prevent an undesired increase in insertion loss.

The above and other features, elements, characteristics, steps, and advantages of the present invention will become more apparent from the following detailed description of preferred embodiments of the present invention with reference to the attached drawings.

BRIEF DESCRIPTION OF THE DRAWINGS

FIG. 5 shows a circuit diagram of an example of a directional coupler according to a second preferred embodiment of the present invention.

FIGS. 6A, 6B, 6C, and 6D show the structure of a directional coupler according to a preferred embodiment of the present invention.

DETAILED DESCRIPTION OF PREFERRED EMBODIMENTS

Figure 1:
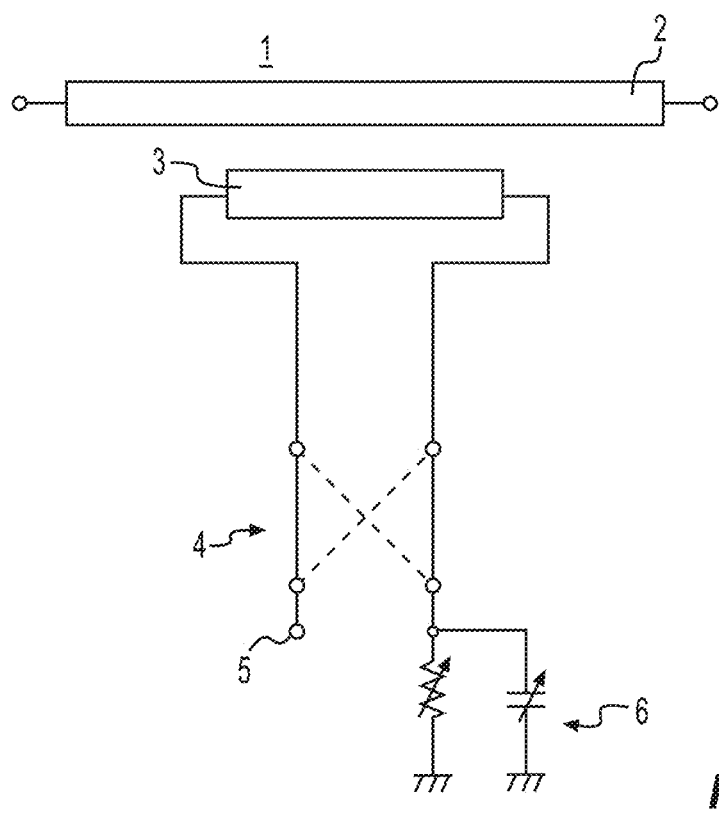
FIG. 1 shows a circuit diagram of a directional coupler of the related art.

Preferred embodiments of the present invention will be described in detail with reference to the drawings. The same or corresponding portions in the drawings are denoted by the same reference signs, and the description thereof will not be repeated.

It should be understood that the foregoing description is only illustrative of the present invention. Various alternatives and modifications can be devised by those skilled in the art without departing from the present invention. Accordingly, the present invention is intended to embrace all such alternatives, modifications, and variances that fall within the scope of the appended claims.

First Preferred Embodiment

Figure 2:
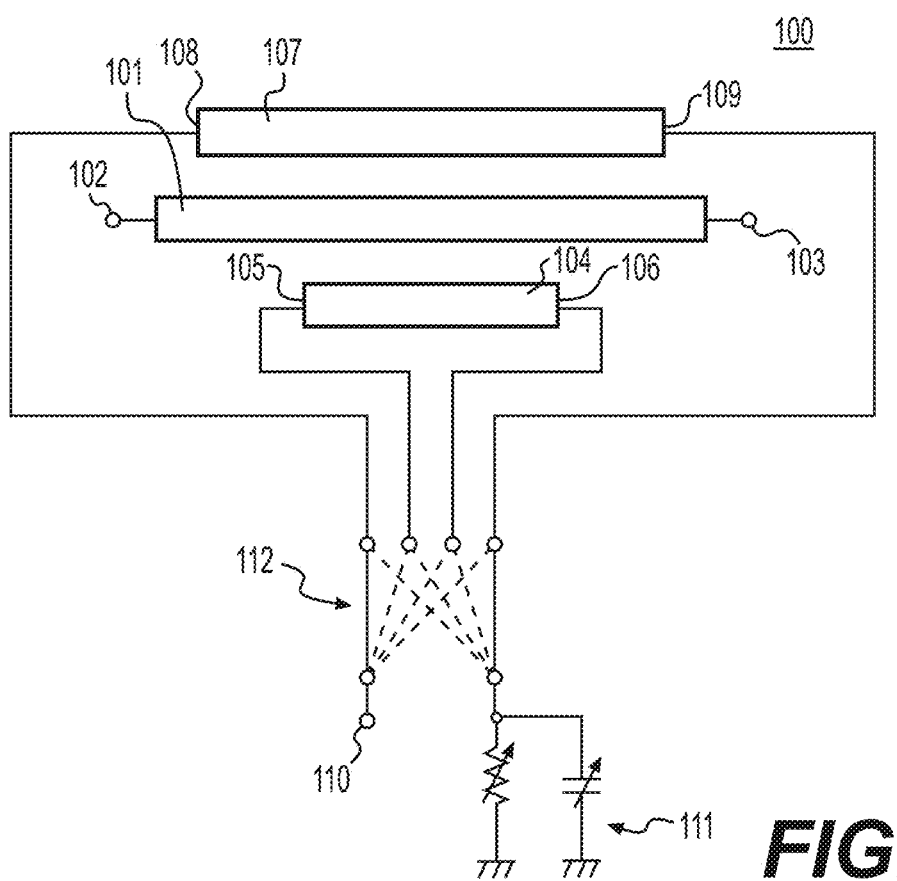
FIG. 2 shows a circuit diagram of a directional coupler according to a first preferred embodiment of the present invention.

FIG. 2 shows a circuit diagram of a directional coupler 100 according to a first preferred embodiment of the present invention.

The directional coupler 100 includes a main line 101 including an input port 102 and an output port 103, a first sub-line 104 including first and second output end 105 and 106, and a second sub-line 107 including first and second output ends 108 and 109. Each of the first and second sub-lines 104 and 107 are coupled to the main line 101, and the degree of coupling between the first sub-line 104 and the main line 101 is different from the degree of coupling between the second sub-line 107 and the main line 101. In order to provide the different degrees of coupling, the first and second sub-lines 104 and 107 can have one or more of different sizes, distances from the main line 101 and lengths, for example. In the directional coupler 100, the first and second sub-lines 104 and 107 have different lengths from each other in order to have different degrees of coupling.

The directional coupler 100 further includes a common output port 110, a termination circuit 111, and a switch circuit 112. A detection signal generated by a signal that is transmitted in the main line 101 is output to the common output port 110. In other words, a detection signal is generated by the signal that is transmitted in the main line 101. The detection signal is transmitted through one of the first and second sub-lines 104 and 107 that is selectively connected to the common output port 110. One of the first and second sub-lines 104 and 107 is selectively connected to the common output port 110 and the termination circuit 111 by the switch circuit 112. If the first sub-line 104 is connected to the common output port 110 and the termination circuit 111 by the switch circuit 112, then one of the first and second output ends 105 and 106 of the first sub-line 104 may be connected to the common output port 110 by the switch circuit 112, and the other of the first and second output ends 105 and 106 of the first sub-line 104 may be connected to the termination circuit 111 by the switch circuit 112. If the second sub-line 107 is connected to the common output port 110 and the termination circuit 111 by the switch circuit 112, then one of the first and second output ends 108 and 109 of the second sub-line 107 may be connected to the common output port 110 by the switch circuit 112, and the other of the first and second output ends 108 and 109 of the second sub-line 107 may be connected to the termination circuit 111 by the switch circuit 112. With this structure and configuration of the switch circuit 112, it is possible to change (1) the sub-line 104 or 107 that is coupled to the main line 101, and (2) the direction in which a signal is transmitted in the first and second sub-lines 104 and 107, i.e., change the directivity of the signal. In other words, the switch circuit 112 defines and functions as both a sub-line switch and a directivity switch.

With the structure and configuration of the directional coupler 100 shown in FIG. 2, a desired degree of coupling in a desired frequency range is able to be achieved by selectively connecting one of the first and second sub-lines 104 and 107 to the common output port 110 and the termination circuit 111 using the switch circuit 112, while disconnecting the other one of the first and second sub-lines 104 and 107 from the common output port 110 and the termination circuit 111. It is also possible to significantly change the degree of coupling and the frequency band thereof without significantly increasing the insertion loss in the main line 101.

Figure 3:
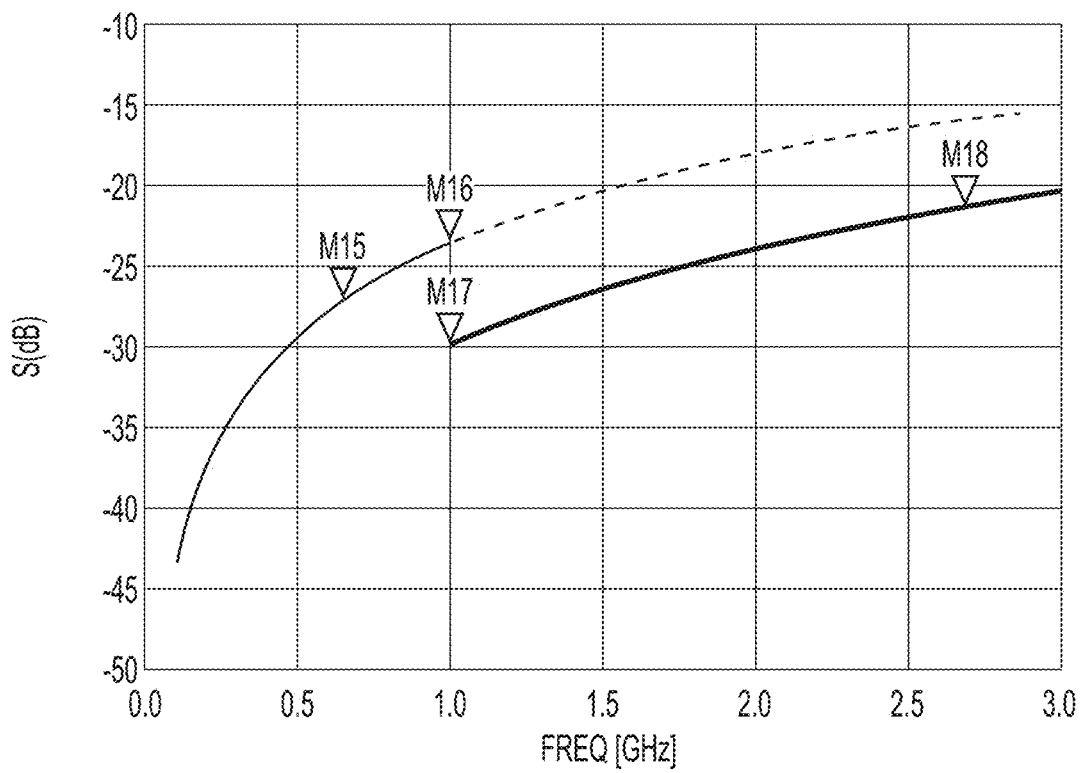
FIG. 3 is a graph showing the coupling degree in a directional coupler according to a preferred embodiment of the present invention when a first sub-line is used and when a second sub-line is used.
Figure 4:
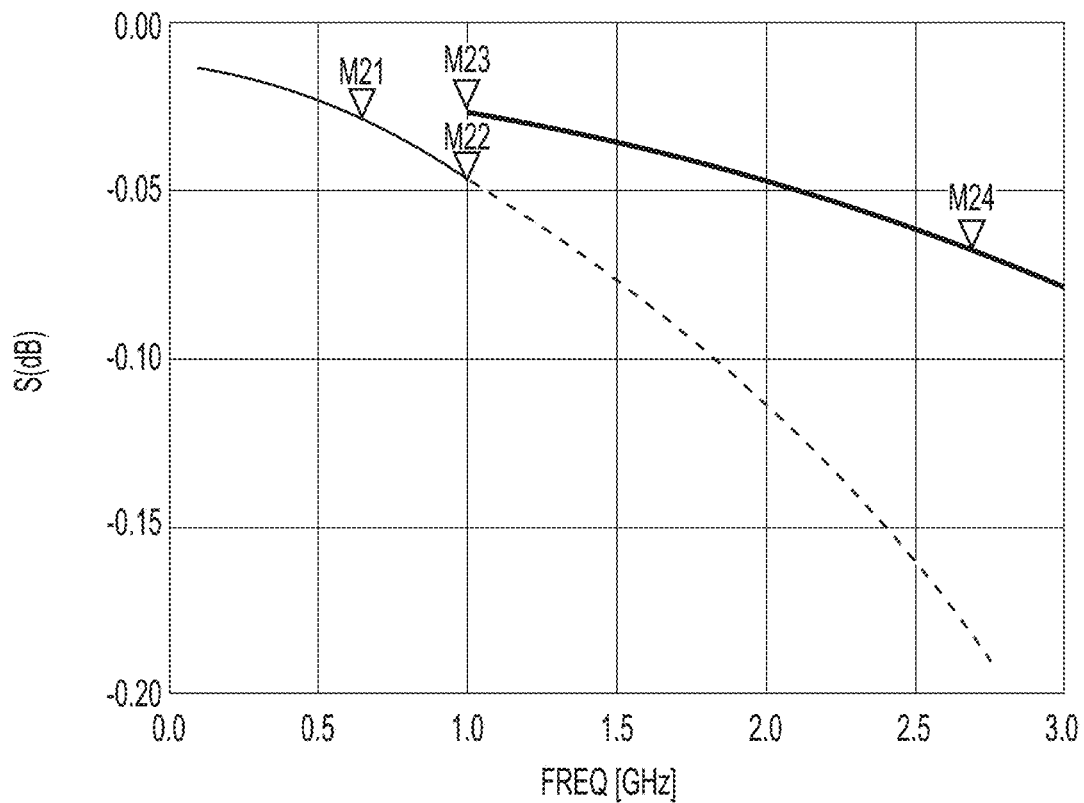
FIG. 4 is a graph showing the insertion loss in a directional coupler according to a preferred embodiment of the present invention when a first sub-line is used and when a second sub-line is used.

With the structure and configuration of the directional coupler 100, it is possible to achieve a desired degree of coupling in a desired frequency band without significantly increasing the insertion loss in the main line 101. FIG. 3 is a graph showing the coupling degree versus frequency, and FIG. 4 is a graph showing the insertion loss versus frequency. In FIG. 3, the line connecting points M15 and M16 shows the coupling degree of the second sub-line 107, and the line connecting points M17 and M18 shows the coupling degree of the first sub-line 104. In FIG. 4, the line connecting points M21 and M22 shows the insertion loss of the second sub-line 107, and the line connecting points M23 and M24 shows the insertion loss of the first sub-line 104. As shown in FIGS. 3 and 4, the second sub-line 107 can be selected for frequencies less than 1 GHz, and the first sub-line 104 can be selected for frequencies above 1 GHz. Although a 1-GHz transition frequency is shown in FIGS. 3 and 4, other transition frequencies can also be used. Selecting different sub-lines for different frequency bands allows the coupling degree to be kept below a certain level and allows the insertion loss to be kept above a certain level. Additional sub-lines can be added for the same purposes in different frequency bands.

As shown in FIG. 3, for example, when the first sub-line 104 is connected to the common output port 110 and the termination circuit 111, a coupling degree of about −24 dB is provided in the vicinity of about 2 GHz, and when the second sub-line 107 is connected to the common output port 110 and the termination circuit 111, a coupling degree of about −24 dB is obtained in the vicinity of about 900 MHz. As shown in FIG. 4, when the second sub-line 107 is connected to the common output port 110 and the termination circuit 111, an insertion loss of about 0.12 dB occurs in the vicinity of about 2 GHz. When the first sub-line 104 is connected to the common output port 110 and the termination circuit 111, the insertion loss in the vicinity of about 2 GHz is reduced to about 0.05 dB. It is noted that the insertion loss in the vicinity of 900 MHz is about 0.04 dB when the second sub-line 107 is connected to the common output port 110 and the termination circuit 111.

Accordingly, by selectively connecting one of the first or second sub-line 104 and 107 to the common output port 110 and the termination circuit 111 and disconnecting the other one of the first and second sub-lines 104 and 107 from the common output port 110 and the termination circuit 111, a desired coupling degree is able to be obtained without excessively increasing the insertion loss.

The termination circuit 111 can be a variable termination circuit, for example. However, the termination circuit 111 may be other types of termination circuits, such as a fixed termination circuit, for example. Further, the termination circuits in the following preferred embodiments described below can each be variable termination circuits. However, as in the present preferred embodiment, the termination circuits in the following preferred embodiments described below may be other types of termination circuits, such as a fixed termination circuit, for example.

FIGS. 6A to 6D show an example of the structure of the directional coupler 100 according to the present preferred embodiment. FIG. 6A shows the outside appearance of the directional coupler 100. FIG. 6B is an exploded view of the direction coupler 100. FIG. 6C is an exploded view of the external terminal substrate 200 of the directional coupler 100. FIG. 6C is a see-through planar view of the external terminal substrate 200 of the directional coupler 100.

As shown in FIGS. 6A to 6D, the directional coupler 100 includes an external terminal substrate 200, a semiconductor chip 201 disposed on a main surface of the external terminal substrate 200, for example, by flip-chip mounting, and a mold resin 202 disposed on the main surface of the external terminal substrate 200 and embedding the semiconductor chip 201 therein. A shielding layer 203 can be disposed on an outer surface of the mold resin 202. The shielding layer 203 can be, for example, a metal film provided by sputtering or plating on at least a portion of the top surface and side surfaces of the mold resin 202. However, the shielding layer 203 may be omitted. The mold resin can be an epoxy resin, but may be any suitable material. Furthermore, when the semiconductor chip 201 is flip-chip mounted on the external terminal substrate 200, an underfill resin may be provided between the semiconductor chip 201 and the external terminal substrate 200.

The external terminal substrate 200 can be a multilayer substrate including a plurality of layers 200A-200E, for example. However, the external electrode substrate 200 may include a single layer. In the present preferred embodiment, the multilayer substrate includes five layers 200A-200E. However, the multilayer substrate may include any suitable number of layers. The external terminal substrate 200 can be, for example, a printed circuit board. However, the external terminal substrate 200 may be any suitable type of substrate.

In the present preferred embodiment, a plurality of bonding pads 301 are provided on an upper surface of the external terminal substrate (on an upper surface of the layer 200A), the first sub-line 104 is provided on a surface of the layer 200B, the main line 101 is provided on a surface of the layer 200C, the second sub-line 107 is provided on a surface of the layer 200D, and external terminals 300 are provided on a lower surface of the external terminal substrate 200 (a lower surface of the layer 200E). The external terminals 300 are provided to mount the directional coupler 10 to a substrate or a device (not shown).

The first and second output ends 105 and 106 of the first sub-line 104 and the first and second output ends 108 and 109 of the second sub-line 107 are connected to respective ones of the bonding pads 301 by via electrodes V that extend through respective layers 200A-200C of the external terminal substrate 200. The input port 102 and the output port 103 of the main line 101 are connected to respective ones of the external terminals 300 by via electrodes V.

In the present preferred embodiment, the main line 101 and the first and second sub-lines 102 and 103 are disposed inside of the external terminal substrate 200. However, the main line 101 and the first and second sub-lines 104 and 107 may be disposed in any suitable arrangement as long as each of the first and second sub-lines 104 and 107 are coupled to the main line 101.

The external terminal substrate 200 can be made of any suitable material, such as a dielectric, BT resin, epoxy resin, polyphenylene ether resin, fluorine resin, liquid crystal polymer resin, polyimide resin, for example. The external terminal substrate 200 may include only a dielectric or resin described above, or may include glass fibers or other fillers, in addition to the dielectric or resin described above. Further, a glass ceramic may be used for the external terminal substrate 200. The main line 101 and the first and second sub-lines 104 and 107 may be made of copper foil, copper or silver thick film, and alloy film or be made of a composite film including other suitable metals, for example.

The main line 101 and the first and second sub-lines 104 and 107 may be provided inside the semiconductor chip 201, instead of inside the external terminal substrate 200.

As described above, the semiconductor chip 201 can be flip-chip mounted on the external terminal substrate 200. More specifically, the semiconductor chip 201 can be connected to the bonding pad 301 on the upper surface of the external terminal substrate 200 via solder bump mounting, for example. Alternatively, the semiconductor chip 201 may be mounted on the external terminal substrate 200 in any suitable manner.

In the present preferred embodiment, it is possible to incorporate the main line 101 and the first and second sub-lines 104 and 107 in the external terminal substrate 200 in order to effectively use the space in the external terminal substrate 200. Since the main line 101 and the first and second sub-lines 104 and 107 are not provided in the semiconductor chip 201, the size of the semiconductor chip 201 can be reduced. In addition, since the size of the semiconductor chip 201 can be reduced, not only is the semiconductor chip 201 less expensive to produce, but the deflection and thermal stress can also be reduced so as to improve the mounting reliability of the semiconductor chip 201. The common output terminal 110 in FIG. 2 is one of the external terminals 300 in FIG. 6C other than the external terminals 300 connected to the input port 102 and the output port 103. The termination circuit 111 is not shown in FIGS. 6A-6D. However, the termination circuit 111 can be provided inside the semiconductor chip 201 or can be provided on the external terminal substrate 200.

Further, when the main line 101 is provided in the external terminal substrate 200, since a large high frequency signal is transmitted through the main line 101, the semiconductor chip 201 is prevented from being exposed to the large high frequency signal, distortion generated in the main line signal is reduced or minimized, and reliability is increased. Since the main line 101 is provided in the external terminal substrate 200, a large high frequency signal is transmitted through the main line 101, and the semiconductor chip 201 is prevented from being exposed to the large high frequency signal. Since the external terminal substrate 200, in which the main line 101 is provided, is made of a material which has good linearity, distortion generated in the main line signal is reduced or minimized. When the main line 101 is provided in the external terminal substrate 200, the main line 101 is prevented from being disconnected at a junction between the external terminal substrate 200 and the semiconductor chip 201, and thus increasing reliability.

Although the processing accuracy of the main line 101 and the first and second sub-lines 104 and 107 is inferior in the external terminal substrate 200 as compared to when the main line 101 and the first and second sub-lines 104 and 107 are provided in the semiconductor chip 201, the processing accuracy can be compensated for by providing a variable termination circuit, for example, in a semiconductor chip 201, and adjusting the impedance thereof.

Figure 7:
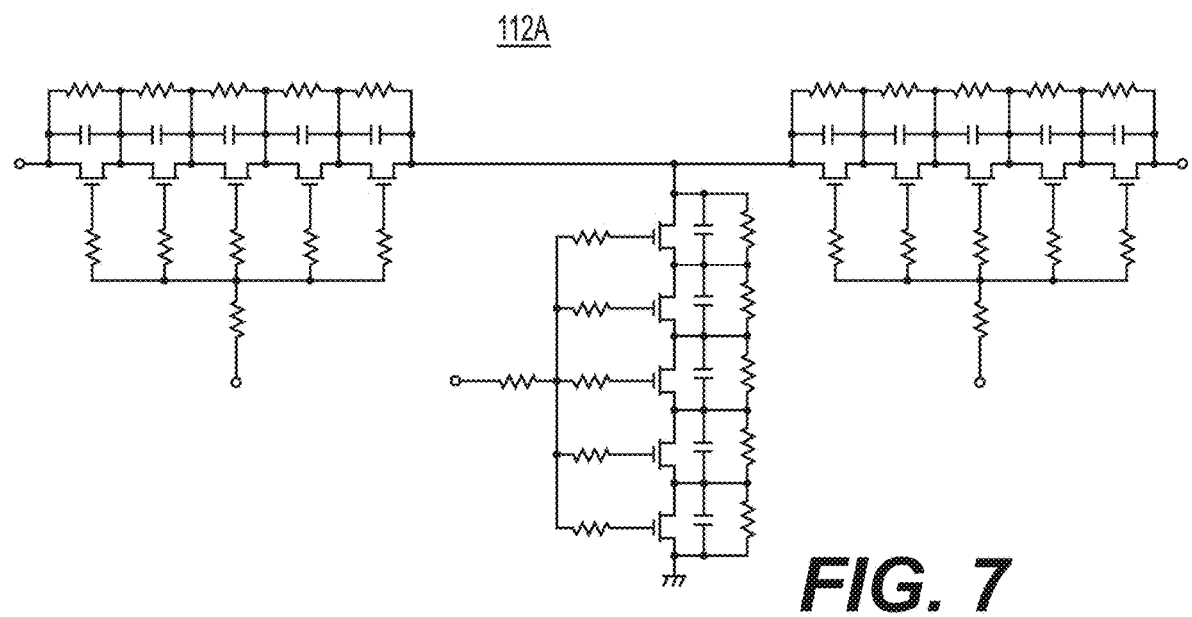
FIG. 7 shows an example of stacked switches used in a directional coupler according to a preferred embodiment of the present invention.

In the present preferred embodiment, the switching circuit 112 is provided in the semiconductor chip 201. The switching circuit 112 can be a semiconductor switch including, for example, one or more transistors. However, other suitable types of switches may be provided in the semiconductor chip 201. Control of the switching circuit 112 is performed by applying a control voltage to the switching circuit 112. If a withstand voltage is needed, a plurality of transistors may be connected in series as, for example, a stacked switch. An example of a stacked switch is shown in FIG. 7. FIG. 7 shows a T-type stacked switch 112A. However, the stacked switch may be an L-type switch or other suitable type of switch, for example. The stacked switch defining the switching circuit 112 can be used when isolation characteristics are required.

In the T-type switching circuit 112A, a resistor is connected in series with a control terminal (gate terminal) of each transistor in the stacked switch. Bias voltage is provided to each control terminal of the transistors via each of the resistors. Also, capacitors are connected between a drain terminal and a source terminal of each transistor. By connecting these capacitors to the transistors, off capacitances of each of the transistors can be compensated for. Resistors are also connected between the drain terminal and the source terminal of each transistor, in parallel with the capacitors. By providing these resistors, the potential of the drain terminal and the source terminal can be corrected, and the bias voltage can be appropriately provided to the transistors.

The T-type stacked switch 112A includes two series switch blocks which are connected in series in a line between terminals, and one shunt switch block which is connected in series in a line between a node between the two series switch blocks and the ground. When an RF signal is transmitted from one terminal to another terminal, the two series switch blocks are conductive, and the shunt switch block is non-conductive. When an RF signal is not transmitted from one terminal to another terminal, the two series switch blocks are non-conductive, and the shunt switch block is conductive. On the other hand, the shunt switch block can be non-conductive when the two series switch blocks are non-conductive.

The termination circuit 111 may include a variable shunt resistor, or a variable shunt capacitor, for example. Further, any of the variable shunt resistor and the variable shunt capacitor may be connected in parallel with one another, and a semiconductor switch including a transistor may be used to vary the termination circuit 111 by connecting and disconnecting the desired circuit element described above.

Although FIGS. 6A to 6D show the structure of the directional coupler 100 according to the first preferred embodiment, each of the following preferred embodiments described below may include the same or similar structure as that shown in FIGS. 6A to 6D.

Second Preferred Embodiment

FIG. 5 shows a circuit diagram of a directional coupler 100A according to a second preferred embodiment of the present invention. In FIG. 5, the same or corresponding elements and portions as those of the first preferred embodiment are denoted by the same reference characters, and descriptions thereof are omitted.

The directional coupler 100A includes a first switch circuit 113 and a second switch circuit 114 that are separate from one another. The first switch circuit 113 selectively connects and disconnects the first sub-line 104 or the second sub-line 107 to the common output port 110 and the termination circuit 111. The second switch circuit 114 is a directivity switch that sets the direction in which signals pass through the first sub-line 104 or the second sub-line 107 selected to be connected to the common output port 110 and the termination circuit 111. That is, the second switch circuit 114 switches between (1) a first state in which the first output end 105 of the first sub-line 104 (or the first output end 108 of the second sub-line 107) is connected to the common output port 110 and the second output end 106 of the first sub-line 104 (or the second output end 109 of the second sub-line 107) is connected to the termination circuit 111 and (2) a second state in which the second output end 106 of the first sub-line 104 (or the second output end 109 of the second sub-line 107) is connected to the common output port 110 and the first output end 105 of the first sub-line 104 (or the first output end 108 of the second sub-line 107) is connected to the termination circuit 111.

The first and second switch circuits 113 and 114 can be, for example, double-pole, double-throw (DPDT) switches. However, any suitable type of switch may be used for each of the first and second switch circuits 113 and 114. The first and second switch circuits 113 and 114 may be defined by the same type of switch or by different types of switches.

Since the first and second switch circuits 113 and 114 are separately provided from one another, it is possible to simplify a logic control configuration of a controller (not shown) controlling the directional coupler 100A. The controller (not shown) may be provided external to the directional coupler 100A or may be provided in the semiconductor chip 201, for example.

The remaining structure and configuration of the directional coupler 100A are the same or substantially the same as those of the first preferred embodiment.

Third Preferred Embodiment

Figure 8:
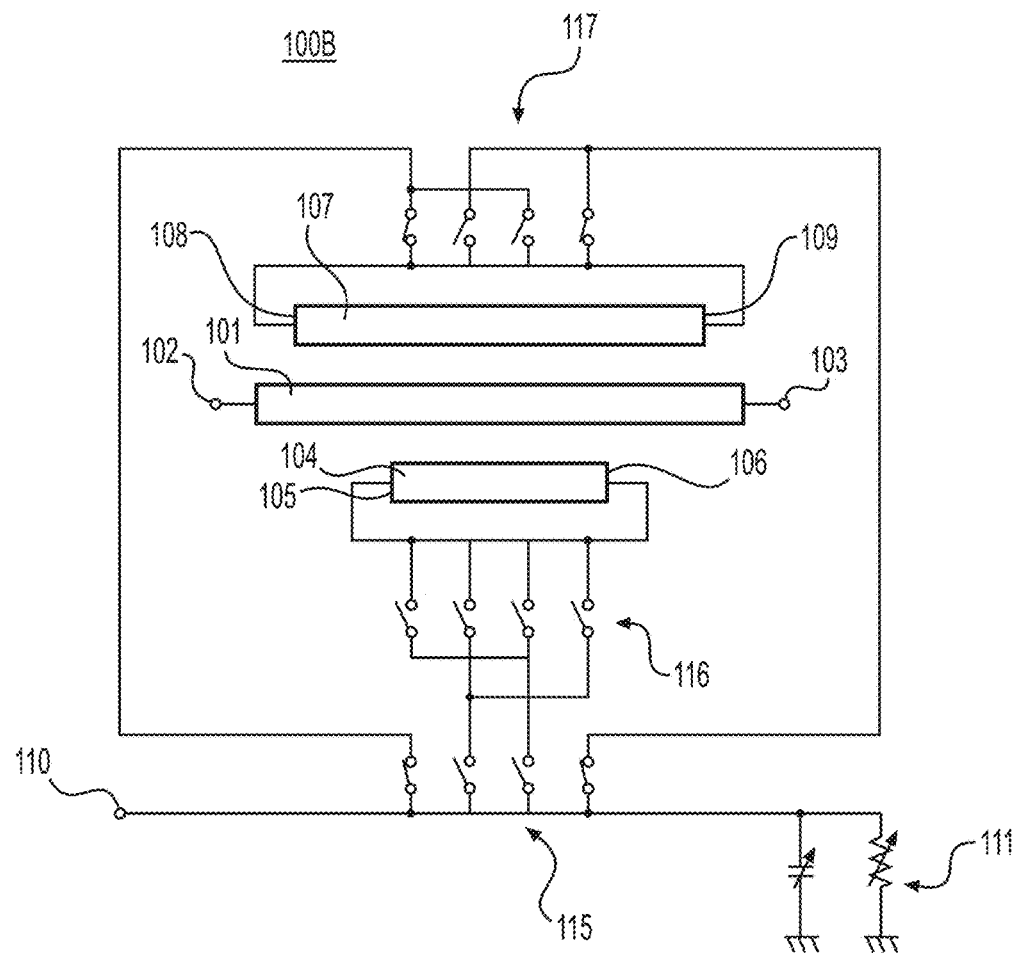
FIG. 8 shows a circuit diagram of a directional coupler according to a third preferred embodiment of the present invention.

FIG. 8 shows a circuit diagram of a directional coupler 100E3 according to a third preferred embodiment of the present invention. In FIG. 8, the same or corresponding elements and portions as those of the previously described preferred embodiments are denoted by the same reference characters, and descriptions thereof are omitted.

The directional coupler 100B includes a first switch circuit 115, a second switch circuit 116, and a third switch circuit 117 that are separate from one another. The first switch circuit 115 selectively connects and disconnects the first sub-line 104 or the second sub-line 107 to the common output port 110 and the termination circuit 111. The second switch circuit 116 is a directivity switch that sets the direction in which signals pass through the first sub-line 104. The third switch circuit 117 is a directivity switch that sets the direction in which signals pass through the second sub-line 107. That is, the second switch circuit 116 switches between a first state in which the first output end 105 of the first sub-line 104 is connected to the common output port 110 and the second output end 106 of the first sub-line 104 is connected to the termination circuit 111 and a second state in which the second output end 106 of the first sub-line 104 is connected to the common output port 110 and the first output end 105 of the first sub-line 104 is connected to the termination circuit 111. Similarly, the third switch circuit 117 switches between a first state in which the first output end 108 of the second sub-line 107 is connected to the common output port 110 and the second output end 109 of the second sub-line 107 is connected to the termination circuit 111 and a second state in which the second output end 109 of the second sub-line 107 is connected to the common output port 110 and the first output end 108 of the second sub-line 107 is connected to the termination circuit 111.

With the structure and configuration of the present preferred embodiment, since each of the first, second, and third switch circuits 115, 116, and 117 are separately provided from one another, it is possible to simplify a logic control configuration of a controller (not shown) controlling the directional coupler 1006. In addition, when the first sub-line 104 is not being used, the first sub-line 104 is separated from the common output port 110 and the termination circuit 111 in two stages by the first switch circuit 115 and the second switch circuit 116. Similarly, when the second sub-line 107 is not being used, the second sub-line 107 is separated from the common output port 110 and the termination circuit 111 in two stages by the first switch circuit 115 and the third switch circuit 117. This two-stage separation improves the isolation characteristics of the directional coupler 1006, such that unnecessary signals are highly isolated.

The first, second, and third switch circuits 115, 116, and 117 can be, for example, double-pole, double-throw (DPDT) switches. However, any suitable type of switch may be used for each of the first, second, and third switch circuits 115, 116, and 117. The first, second, and third switch circuits 115, 116, and 117 may be defined by the same type of switch or by different types of switches.

The remaining structure and configuration of the directional coupler 100B are the same or substantially the same as those of the first preferred embodiment.

Fourth Preferred Embodiment

Figure 9:
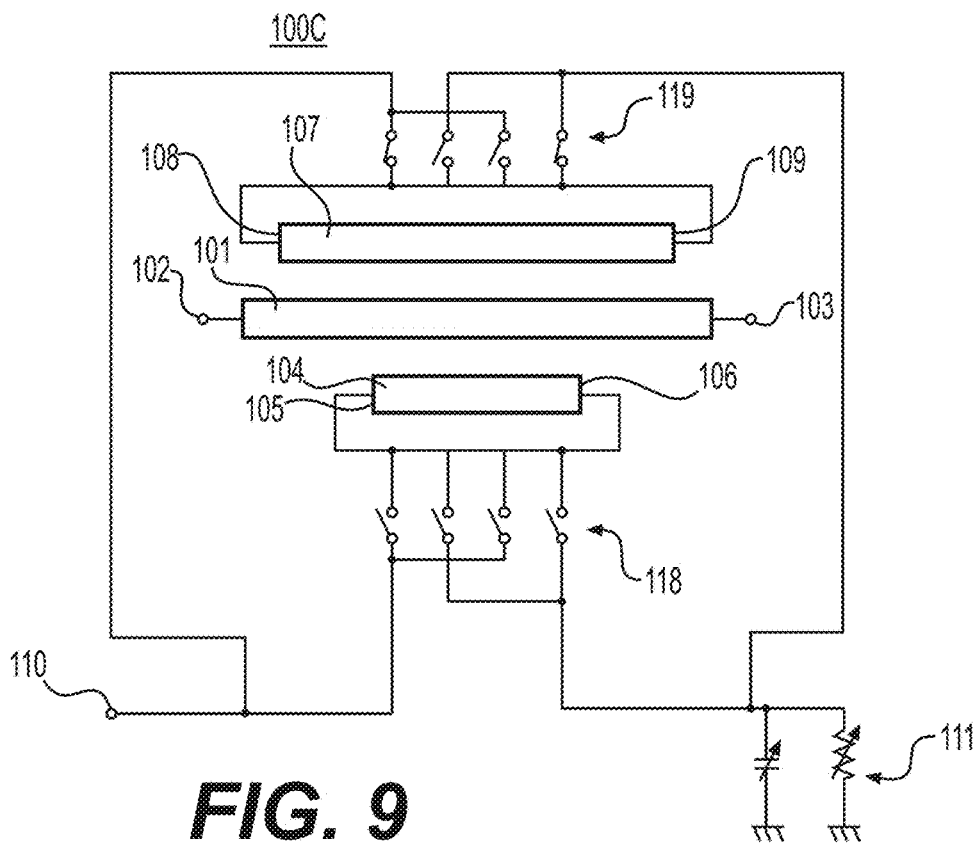
FIG. 9 shows a circuit diagram of a directional coupler according to a fourth preferred embodiment of the present invention.

FIG. 9 shows a circuit diagram of a directional coupler 100C according to a fourth preferred embodiment of the present invention. In FIG. 9, the same or corresponding elements and portions as those of the previously described preferred embodiments are denoted by the same reference characters, and descriptions thereof are omitted.

The directional coupler 100C according to the present preferred embodiment includes a first switch circuit 118 and a second switch circuit 119 that are separate from one another. The first switch circuit 118 selectively connects and disconnects the first sub-line 104 to the common output port 110 and the termination circuit 111 and also defines and functions as a directivity switch that sets the direction in which signals pass through the first sub-line 104. The second switch circuit 119 selectively connects and disconnects the second sub-line 107 to the common output port 110 and the termination circuit 111 and also defines and functions as a directivity switch that sets the direction in which signals pass through the second sub-line 107. That is, each of the first and second switch circuits 118 and 119 combines the functions of sub-line switching and direction switching. In other words, each of the first and second switch circuits 118 and 119 define and function as both of a sub-line switch and a directivity switch.

With the structure and configuration of the directional coupler 100C of the present preferred embodiment, the first and second switch circuits 118 and 119 can be reduced in size, while providing both sub-line switching and direction switching.

The first and second switch circuits 118 and 119 can be, for example, double-pole, double-throw (DPDT) switches. However, any suitable type of switch may be used for each of the first and second switch circuits 118 and 119. The first and second switch circuits 118 and 119 may be defined by the same type of switch or by different types of switches.

The remaining structure and configuration of the directional coupler 100C are the same or substantially the same as those of the first preferred embodiment.

Fifth Preferred Embodiment

Figure 10:
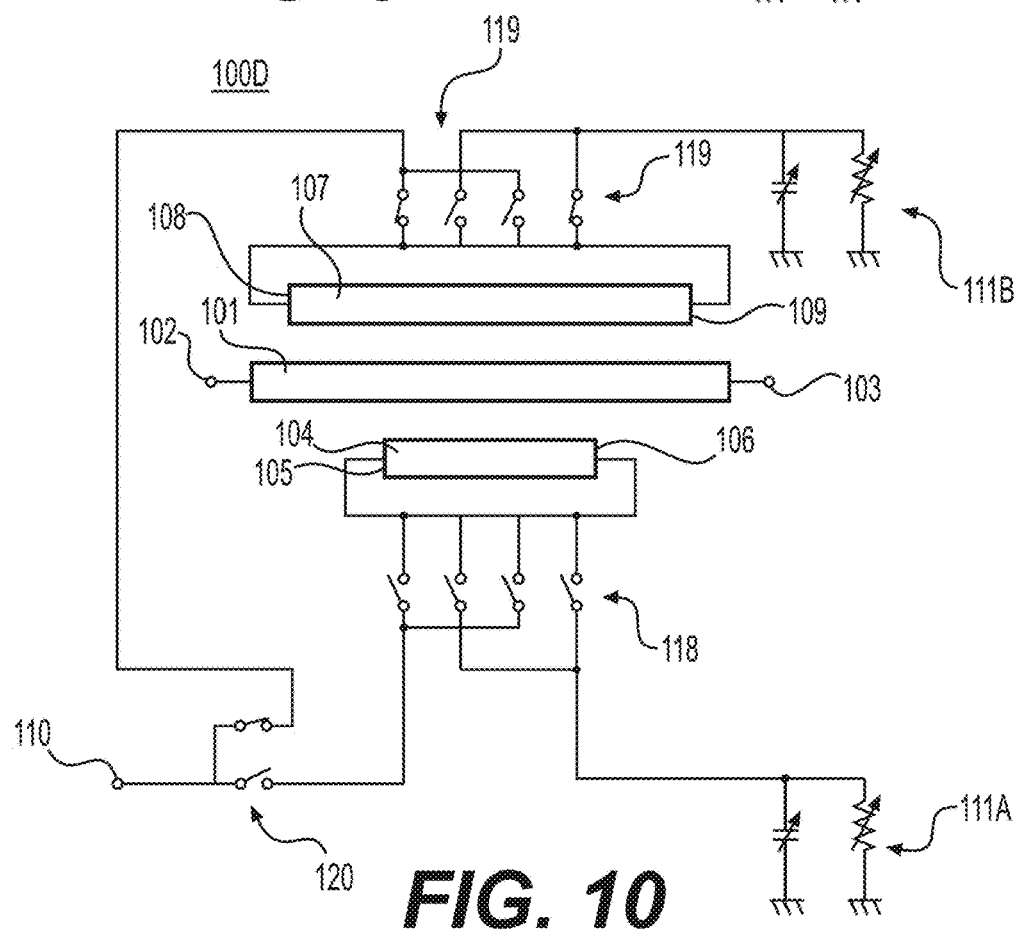
FIG. 10 shows a circuit diagram of a directional coupler according to a fifth preferred embodiment of the present invention.

FIG. 10 shows a circuit diagram of a directional coupler 100D according to a fifth preferred embodiment of the present invention. In FIG. 10, the same or corresponding elements and portions as those of the previously described preferred embodiments are denoted by the same reference characters, and descriptions thereof are omitted.

The structure and configuration of the directional coupler 100D according to the present preferred embodiment is the same or substantially the same as the directional coupler 100C according to the fourth preferred embodiment, except that the directional coupler 100D includes first and second termination circuits 111A and 111B that are separately provided for the first and second sub-lines 104 and 107, respectively. That is, the first termination circuit 111A is independently provided for the first sub-line 104, and the second termination circuit 111B is independent provided for the second sub-line 117. The directional coupler 100D further includes a third switch 120 that selectively connects the common output port 110 to either the first sub-line 104 or the second sub-line 107.

In the directional coupler 100D, the first switch circuit 118 is a directivity switch that provides only the function of setting the direction in which signals are transmitted in the first sub-line 104, and the second switch circuit 119 is a directivity switch that provides only the function of setting the direction in which signals are transmitted in the second sub-line 107. The third switch circuit 120 provides the function of sub-line switching to selectively connect either of the first sub-line 104 or the second sub-line 107 to the common output port 110.

With the structure and configuration of the directional coupler 100D, the logic of the first and second switch circuits 118 and 119 (directivity switching) is independent of the logic of the third switch circuit 120 (sub-line switching). Accordingly, it is possible to simplify a logic control configuration of a controller (not shown) controlling the directional coupler 100D. In addition, when the first sub-line 104 is not being used, the first sub-line 104 is separated from the common output port 110 and the first termination circuit 111A in two stages by the first switch circuit 118 and the third switch circuit 120. Similarly, when the second sub-line 107 is not being used, the second sub-line 107 is separated from the common output port 110 and the second termination circuit 111B in two stages by the second switch circuit 119 and the third switch circuit 120. This two-stage separation improves the isolation characteristics of the directional coupler 100D, such that unnecessary signals are highly isolated. In addition, by providing the first and second termination circuits 111A and 111B separately from one another, heat generated during operation of the directional coupler 100D is dispersed, and damage to the directional coupler 100D caused by excessive heat is prevented.

Further, by providing the first and second termination circuits 111A and 111B independently for the respective first and second sub-lines 104 and 107, once the first and second termination circuits 111A and 111B have been adjusted, the first and second termination circuits 111A and 111B do not need to be further adjusted even when switching between the first and second sub-lines 104 and 107. Accordingly, it is possible to simplify the operation and control of the directional coupler 100D because the termination circuits 111A and 111B do not need to be constantly and/or repeatedly re-adjusted. In addition, it is possible to reduce and/or distribute the loss load of the termination circuits 111A and 111B when switching and using the first and second sub-lines 104 and 107 at high-speed time divisions.

The remaining structure and configuration of the directional coupler 100D are the same or substantially the same as those of the first preferred embodiment.

Sixth Preferred Embodiment

Figure 11:
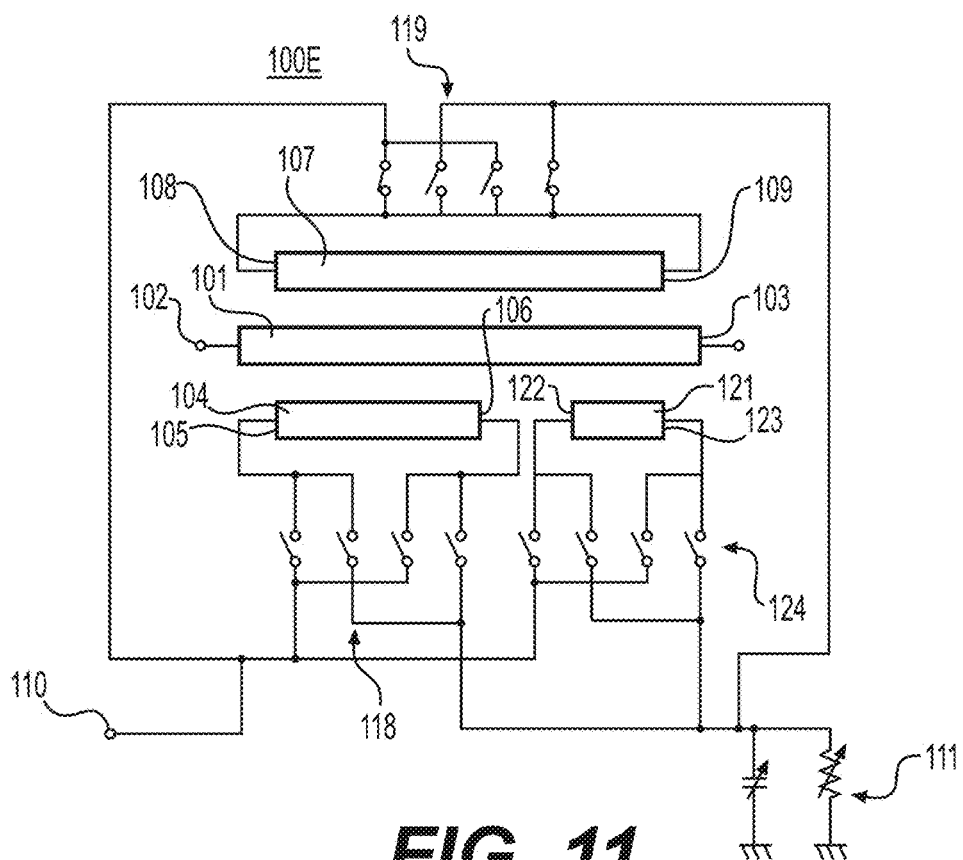
FIG. 11 shows a circuit diagram of a directional coupler according to a sixth preferred embodiment of the present invention.

FIG. 11 shows a circuit diagram of a directional coupler 100E according to a sixth preferred embodiment of the present invention. In FIG. 11, the same or corresponding elements and portions as those of the previously described preferred embodiments are denoted by the same reference characters, and descriptions thereof are omitted.

The structure and configuration of the directional coupler 100E according to the present preferred embodiment is the same or substantially the same as the directional coupler 100C according to the fourth preferred embodiment, except that the directional coupler 100E includes a third sub-line 121 including first and second output ends 122 and 123. Similar to the first and second sub-lines 104 and 107, the third sub-line 121 is coupled to the main line 101, and the degree of coupling between the third sub-line 121 is different from the degrees of coupling of the first and second sub-lines 104 and 107. The first, second, and third sub-lines 104, 107, and 121 may have one or more of different sizes, distances from the main line 101 and lengths, for example. Similar to the directional coupler 100 according to the first preferred embodiment, in the directional coupler 100E, the first, second, and third sub-lines 104, 107, and 121 have different lengths from one another in order to have different degrees of coupling.

The directional coupler 100E includes the first switch circuit 118, the second switch circuit 119, and a third switch circuit 124 that are separate from one another. The first switch circuit 118 selectively connects and disconnects the first sub-line 104 to the common output port 110 and the termination circuit 111 and also defines and functions as a directivity switch that sets the direction in which signals pass through the first sub-line 104. The second switch circuit 119 selectively connects and disconnects the second sub-line 107 to the common output port 110 and the termination circuit 111 and also defines and functions as a directivity switch that sets the direction in which signals pass through the second sub-line 107. The third switch circuit 124 selectively connects and disconnects the third sub-line 121 to the common output port 110 and the termination circuit 111 and also defines and functions as a directivity switch that sets the direction in which signals pass through the third sub-line 121. That is, each of the first, second, and third switch circuits 118, 119, and 124 combines the functions of sub-line switching and direction switching. In other words, each of the first, second, and third switch circuits 118, 119, and 124 define and function as both a sub-line switch and a directivity switch.

With the structure and configuration of the directional coupler 100E of the present preferred embodiment, the first, second, and third switch circuits 118 and 119 can be reduced in size while achieving both sub-line switching and direction switching. Further, with the first, second, and third sub-lines 104, 107, and 121, it is possible to maintain a desired coupling degree and low insertion loss over a very wide frequency range. For example, the first sub-line 104 may be designed to operate in a high frequency range, the second sub-line 107 may be designed to operate in a middle frequency range, and the third sub-line 121 may be designed to operate in a low frequency range. However, the first, second, and third sub-lines 104, 107, and 121 may be designed to operate in any suitable frequency ranges.

The first, second, and third switch circuits 118, 119, and 124 can be, for example, double-pole, double-throw (DPDT) switches. However, any suitable type of switch may be used for each of the first, second, and third switch circuits 118, 119, and 124. The first, second, and third switch circuits 118, 119, and 124 may be defined by the same type of switch or by different types of switches.

The remaining structure and configuration of the directional coupler 100E are the same or substantially the same as those of the first preferred embodiment.

Seventh Preferred Embodiment

Figure 12:
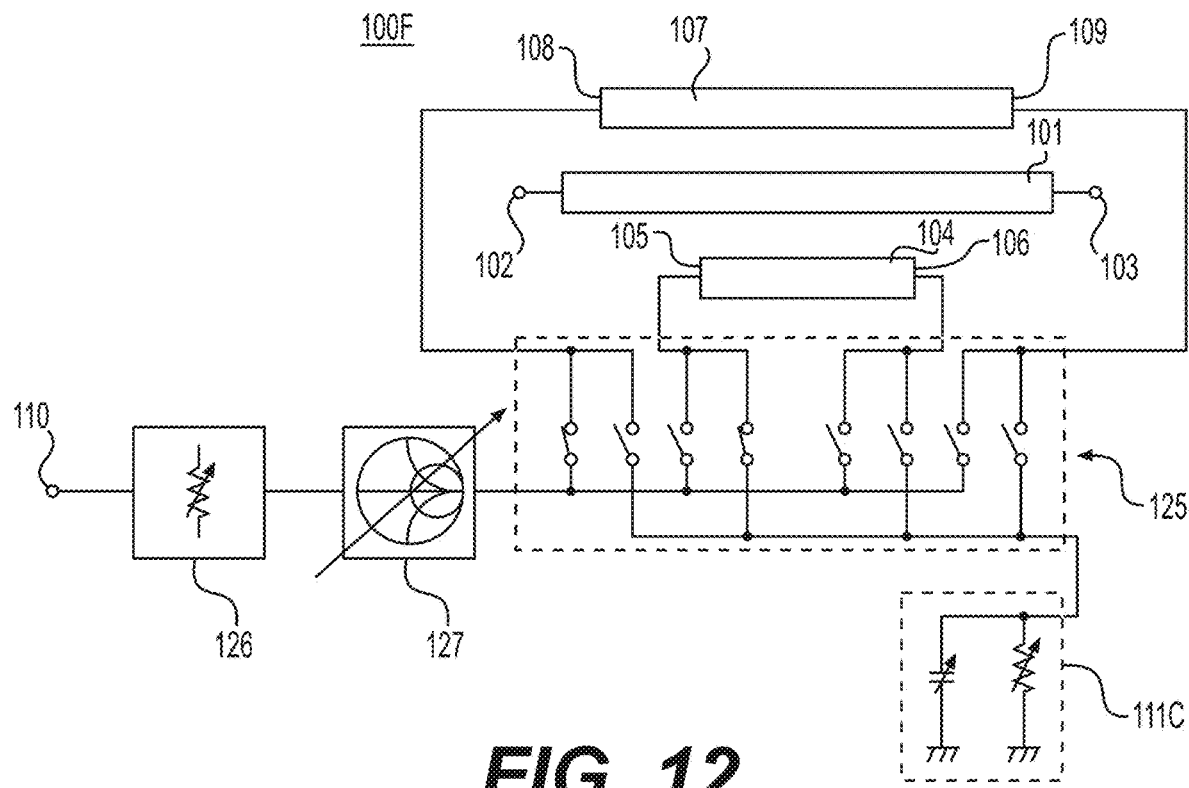
FIG. 12 shows a circuit diagram of a directional coupler according to a seventh preferred embodiment of the present invention.

FIG. 12 shows a circuit diagram of a directional coupler 100F according to a seventh preferred embodiment of the present invention. In FIG. 12, the same or corresponding elements and portions as those of the previously described preferred embodiments are denoted by the same reference characters, and descriptions thereof are omitted.

In the directional coupler 100F according to the present preferred embodiment, a single switch circuit 125 is provided that combines the functions of sub-line switching and direction switching for both of the first sub-line 104 and the second sub-line 107. That is, the switch circuit 125 is shared by the first and second sub-lines 104 and 107. The switch circuit 125 can be, for example, a double-pole, quadruplethrow (DP4T) switch. However, any suitable type of switch may be used for the switch circuit 125.

The termination circuit 111C can include, for example, a variable resistor 1111 and a variable capacitor 1114 connected in parallel. However, the termination circuit 111C may include other suitable circuit components and/or configurations.

The directional coupler 100F of the present preferred embodiment further includes a variable attenuator 126 and a variable matching circuit 127 disposed between the switching circuit 125 and the common output port 110. By appropriately setting the variable attenuator 126, it is possible to obtain a desired coupling coefficient at a plurality of frequencies when either of the first and second sub-lines 104 and 107 is connected to the common output port 110, and when the directivity of the connected one of the first and second sub-lines 104 and 107 is either progressive or reflective. That is, the variable attenuator 126 enables the coupling coefficient to be accurately adjusted to a desired value.

In addition, by appropriately setting the termination circuit 111C and the variable matching circuit 127, it is possible to obtain a desired direction of the signal transmitted in the first sub-line 104 and in the second sub-line 107.

The variable attenuator 126 and the variable matching circuit 127 can be disposed between one of the first and second sub-lines 104 and 107 and the common output port 110.

The remaining structure and configuration of the directional coupler 100E are the same or substantially the same as those of the first preferred embodiment.

Eighth Preferred Embodiment

Figure 13:
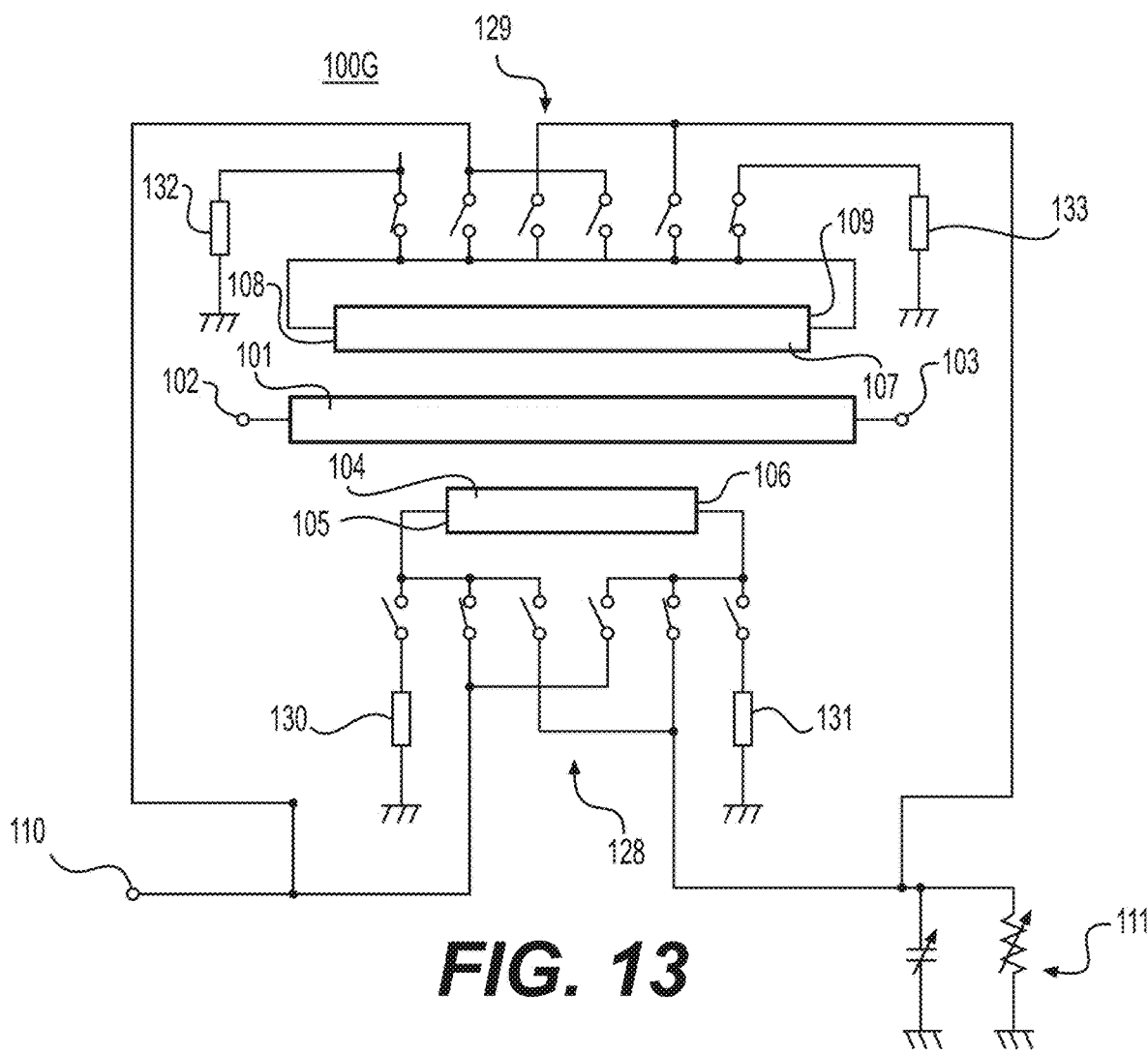
FIG. 13 shows a circuit diagram of a directional coupler according to an eighth preferred embodiment of the present invention.

FIG. 13 shows a circuit diagram of a directional coupler 100G according to an eighth preferred embodiment of the present invention. In FIG. 13, the same or corresponding elements and portions as those of the previously described preferred embodiments are denoted by the same reference characters, and descriptions thereof are omitted.

The directional coupler 100G includes a first switch circuit 128 and a second switch circuit 129 that are separate from one another. The first switch circuit 128 selectively connects and disconnects the first sub-line 104 to the common output port 110 and the termination circuit 111 and also defines and functions as a directivity switch that sets the direction in which signals pass through the first sub-line 104. The second switch circuit 129 selectively connects and disconnects the second sub-line 107 to the common output port 110 and the termination circuit 111 and also defines and functions as a directivity switch that sets the direction in which signals pass through the second sub-line 107. That is, each of the first and second switch circuits 128 and 129 combines the functions of sub-line switching and direction switching.

The directional coupler 100G further includes electrical length adjustment loading circuits 130 and 131 connected between the first sub-line 104 and ground via the first switch circuit 128 and electrical length adjustment loading circuits 132 and 133 connected between the second sub-line 107 and ground via the second switch circuit 129. The first switch circuit 128 selectively enables connection and disconnection of the electrical length adjustment loading circuits 130 and 131 to the first sub-line 104, and the second switch circuit 129 selectively enables connection and disconnection of the electrical length adjustment loading circuits 132 and 133 to the second sub-line 107. By enabling connection and disconnection of the electrical length adjustment loading circuits 132 and 133, a total electrical length (the electrical length adjustment loading circuits 132 and 133 and the respective first or second sub-line 104 or 107) can be adjusted so as to be different from the original electrical length of the respective sub-line 104 or 107.

When the first sub-line 104 is connected to the common output port 110 and the termination circuit 111 so as to be used as a coupler of the directional coupler 100G, the second sub-line 107 is not connected to the common output port 110 and the termination circuit 111, and instead is connected to the electrical length adjustment loading circuits 132 and 133 so as to provide a constant electrical length and be coupled to the main-line 101. With this configuration the second sub-line 107 defines and functions as a band elimination filter that attenuates higher-order harmonic waves of several times more than the signal frequency passing through the main line 101.

Similarly, when the second sub-line 107 is connected to the common output port 110 and the termination circuit 111 so as to be used as a coupler of the directional coupler 100G, the first sub-line 104 is not connected to the common output port 110 and the termination circuit 111, and instead is connected to the electrical length adjustment loading circuits 130 and 131 so as to provide a constant electrical length and be coupled to the main-line 101. With this configuration, the first sub-line 104 defines and functions as a band elimination filter that attenuates higher-order harmonic waves of several times more than the signal frequency passing through the main line 101.

Furthermore, since the sub-line 104 or 107 that is not connected to the common output port 110 and the termination circuit 111 defines and functions as a band elimination filter, a band elimination filter is able to be included in the directional coupler 100G without significantly increasing the size of the directional coupler 100G. In addition, since the band elimination filter is included without providing additional circuit elements in the directional coupler 100G, insertion loss in the signal frequency band at which the directional coupler 100G operates is prevented from significantly increasing.

Each of the first and second switch circuits 128 and 129 can be a DP6T switch, for example, that (1) selectively connects and disconnects the first and second sub-lines 104 to the common output port 110 and the termination circuit 111, (2) defines and functions as a directivity switch that sets the direction in which signals pass through the first and second sub-line 104 and 107, and (3) selectively connects and disconnects the respective electrical length adjustment loading circuits 130, 131, 132, and 133 to the first and second sub-lines 104 and 107. However, other types of switches may be used for the first and second switch circuits 128 and 129.

Figure 14:
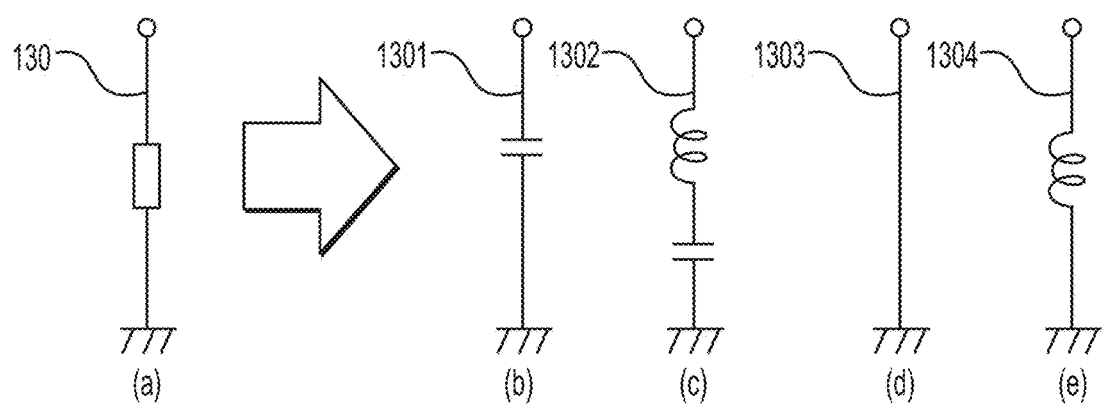
FIG. 14 shows examples electric length adjustment loading circuits included in the directional coupler according to the eighth preferred embodiment of the present invention.

As shown in parts (a) to (e) of FIG. 14, the electrical length adjustment loading circuit 130 as shown in part (a) may include, for example, a shunt capacitor 1301 as shown in part (b), a shunt circuit including an inductor and a capacitor connected in series 1302 to one another as shown in part (c), a shunt wiring line 1303 as shown in part (d), and shunt inductor 1304 as shown in part (e). Similarly, the electrical length adjustment loading circuits 131, 132, and 133 may also include the circuit elements shown in FIG. 14. Each of the electrical length adjustment loading circuits 130, 131, 132, and 133 may include the same circuit elements as one another or may include different circuit elements from one another. However, other suitable circuit elements may be included in each of the electrical length adjustment loading circuits 130, 131, 132, and 133 as appropriate.

The remaining structure and configuration of the directional coupler 100G are the same or substantially the same as those of the first preferred embodiment.

Figure 18:
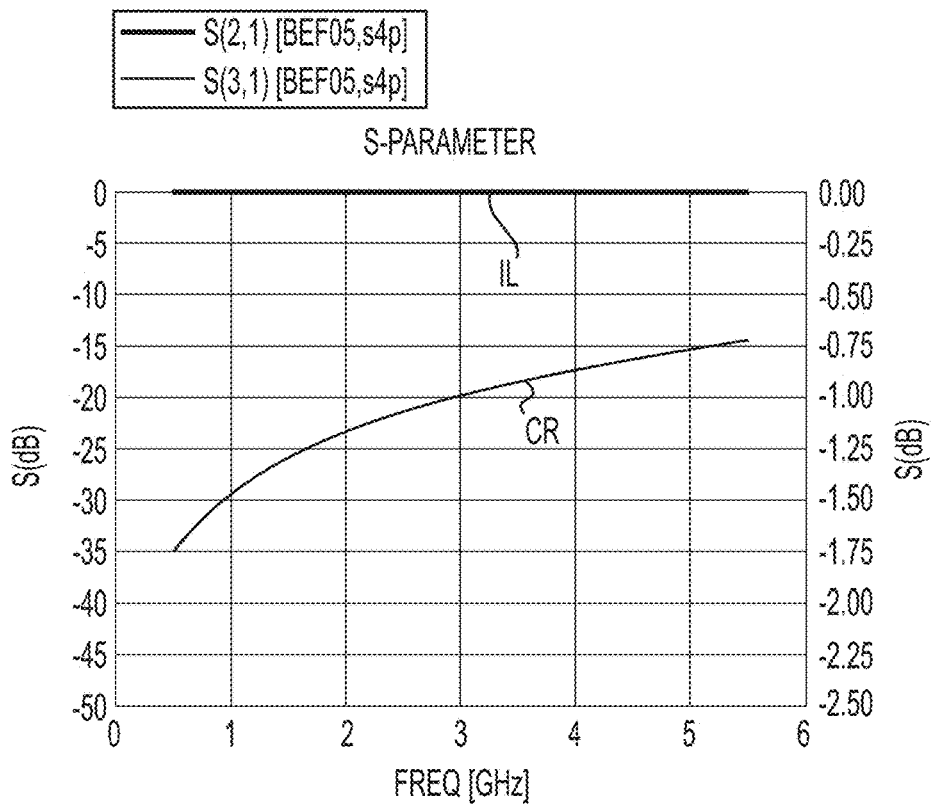
FIG. 18 is a graph showing a coupling degree CR and an insertion loss IL of a directional coupler according to a preferred embodiment of the present invention when electrical length adjustment loading element are not connected to the sub-lines.
Figure 19:
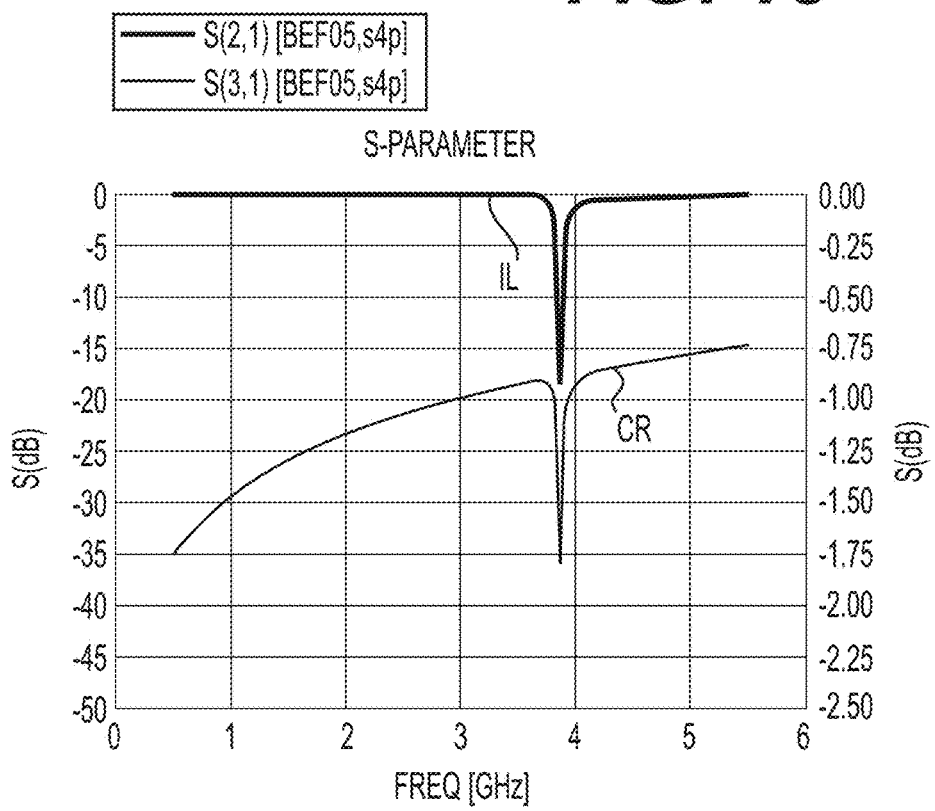
FIG. 19 is a graph showing a coupling degree CR and an insertion loss IL of a directional coupler when respective electrical length adjustment loading circuits are connected to an unused sub-line.

FIG. 18 shows a coupling degree CR and an insertion loss of the directional coupler 100G when the electrical length adjustment loading circuits 130, 131, 132, and 133 are not connected to the first and second sub-lines 104 and 107. In contrast, FIG. 19 shows the coupling degree CR and the insertion loss of the directional coupler 100G when respective electrical length adjustment loading circuits 130, 131, 132, and 133 are connected to an unused one of the first and second sub-lines 104 and 107. As is clear from a comparison of FIGS. 18 and 19, when the respective electrical length adjustment loading circuits 130, 131, 132, and 133 are connected to the unused one of the first and second sub-lines 104 and 107, the unused sub-line defines and functions as a band elimination filter to remove an undesired signal, e.g., a higher-order harmonic wave in the 3.9 GHz band.

Ninth Preferred Embodiment

Figure 15A:
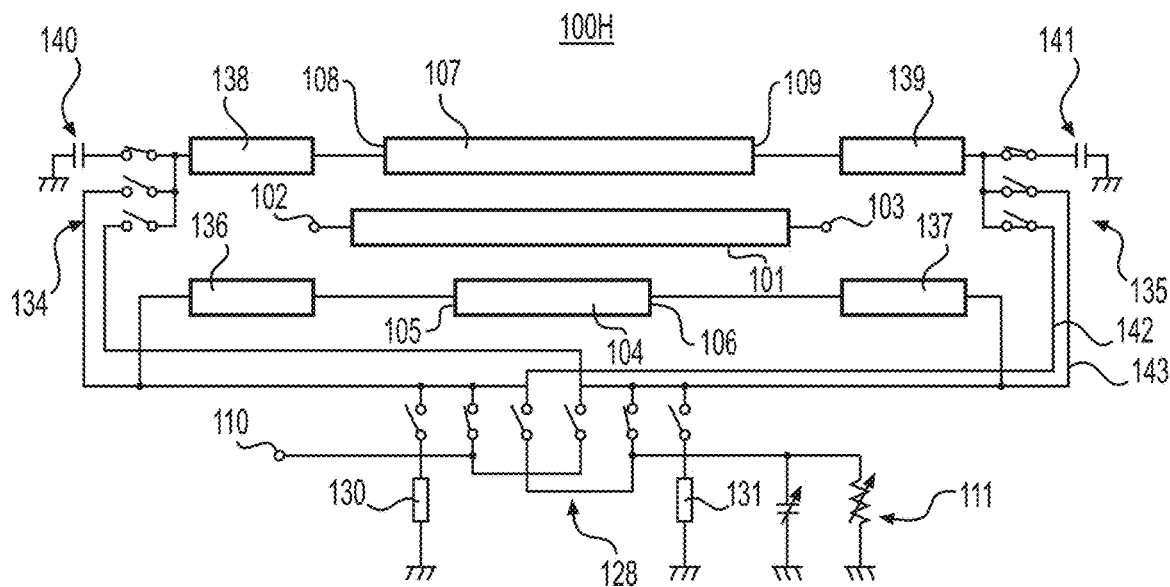
FIG. 15A shows a circuit diagram of a directional coupler according to a ninth preferred embodiment of the present invention.
Figure 15B:
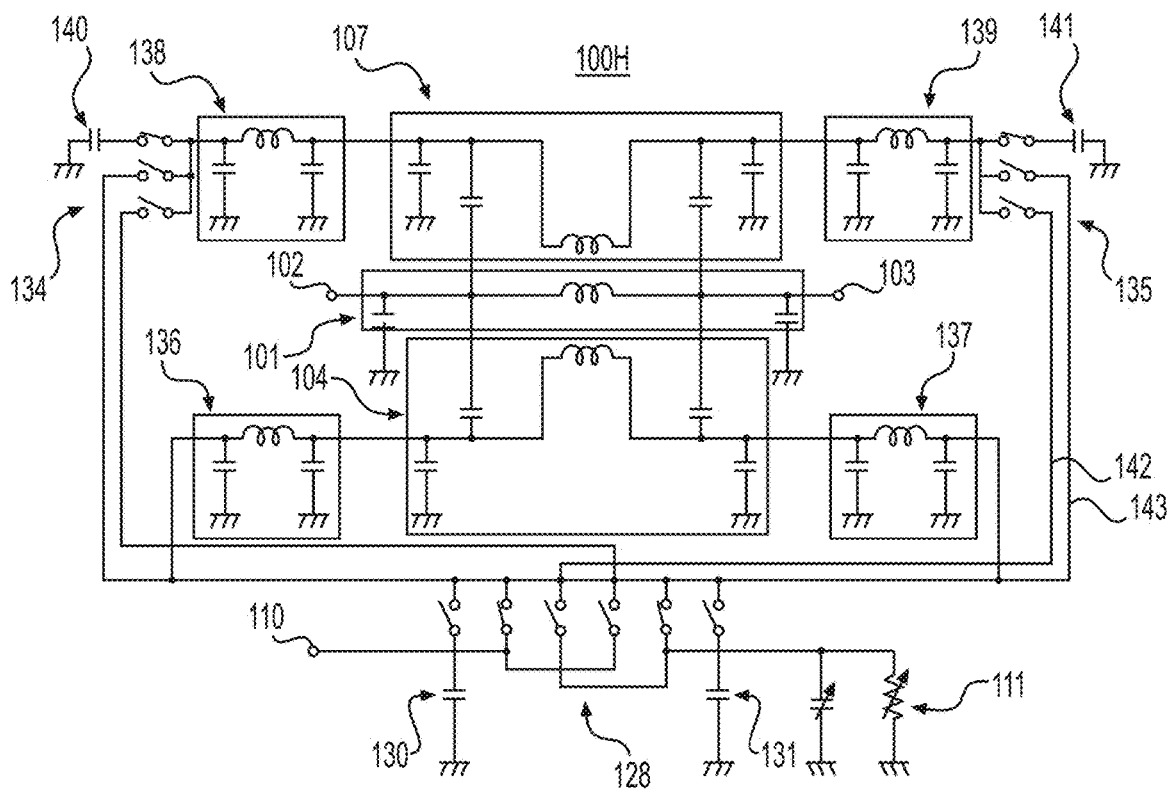
FIG. 15B shows an equivalent circuit thereof.

FIG. 15A shows a circuit diagram of a directional coupler 100H according to a ninth preferred embodiment of the present invention, and FIG. 15B shows an equivalent circuit thereof. In FIGS. 15A and 15B, the same or corresponding elements and portions as those of the previously described preferred embodiments are denoted by the same reference characters, and descriptions thereof are omitted.

The directional coupler 100H shown in FIGS. 15A and 15B is substantially the same as the directional coupler 100G shown in FIG. 14, except that the electrical length adjustment loading circuits 140 and 141 can each be defined by shunt capacitors, two wiring lines 142 and 143 having different lengths are provided between the second sub-line 107 and the first switch circuit 128, and second and third switch circuits 134 and 135 are provided between the second sub-line 107 and the first switch circuit 128. In addition, the directional coupler 100H includes wiring lines 136 and 137 respectively connected to the first and second ends 105 and 106 of the first sub-line 104, and wiring lines 138 and 139 respectively connected to the first and second ends 108 and 109 of the second sub-line 107. Each of the wiring lines 136 to 139 have an equivalent circuit including a series inductance and parallel capacitances as shown in FIG. 15B.

The second switch circuit 134 is configured to (1) selectively connect the second sub-line 107 to the first switch 128 via one of the two wiring lines 142 and 143 and (2) selectively connect or disconnect the electrical length adjustment loading element 140 between the second sub-line 107 and the first switch 128. Similarly, the third switch circuit 135 is configured to (1) selectively connect the second sub-line 107 to the first switch 128 via one of the two wiring lines 142 and 143 and (2) selectively connect or disconnect the electrical length adjustment loading element 141 between the second sub-line 107 and the first switch 128.

With the configuration of the directional coupler 100H shown in FIGS. 15A and 15B, the second sub-line 107 in combination with the main line 101 is able to define and function as a band elimination filter. By defining the electrical length adjustment loading circuits 140 and 141 as capacitors as in the present preferred embodiment, the resonance frequency is able to adjusted to a relatively low desired value when the electrical length adjustment loading circuits 140 and 141 are connected between the second sub-line 107 and the first switch circuit 128.

Since the electrical length adjustment loading circuits 140 and 141 can be defined by capacitors in the present preferred embodiments, it is possible to adjust the center frequency of the band elimination filter to a lower value without significantly increasing the size of the directional coupler 100H, unlike when the electrical length adjustment loading circuits 140 and 141 are defined solely by wiring lines. As such, undesirable signals are able to be removed or prevented at a lower frequency when the capacitors defining the electrical length adjustment loading circuits 140 and/or 141 are connected via the second and third switch circuits 138 and 139.

In addition, the capacitors defining the electrical length adjustment loading circuits 140 and 141 may be provided on a resin substrate, and may each be one of a metal-oxide-metal (MOM) capacitor or a metal-insulator-metal (MIM) capacitor in an integrated circuit, such as the semiconductor chip 201 shown in FIG. 6B. Alternatively, the capacitors defining the electrical length adjustment loading circuits 140 and 141 may be added to a capacitor or transistor in the integrated circuit, such as the semiconductor chip 201 shown in FIG. 6B.

Tenth Preferred Embodiment

Figure 16A:
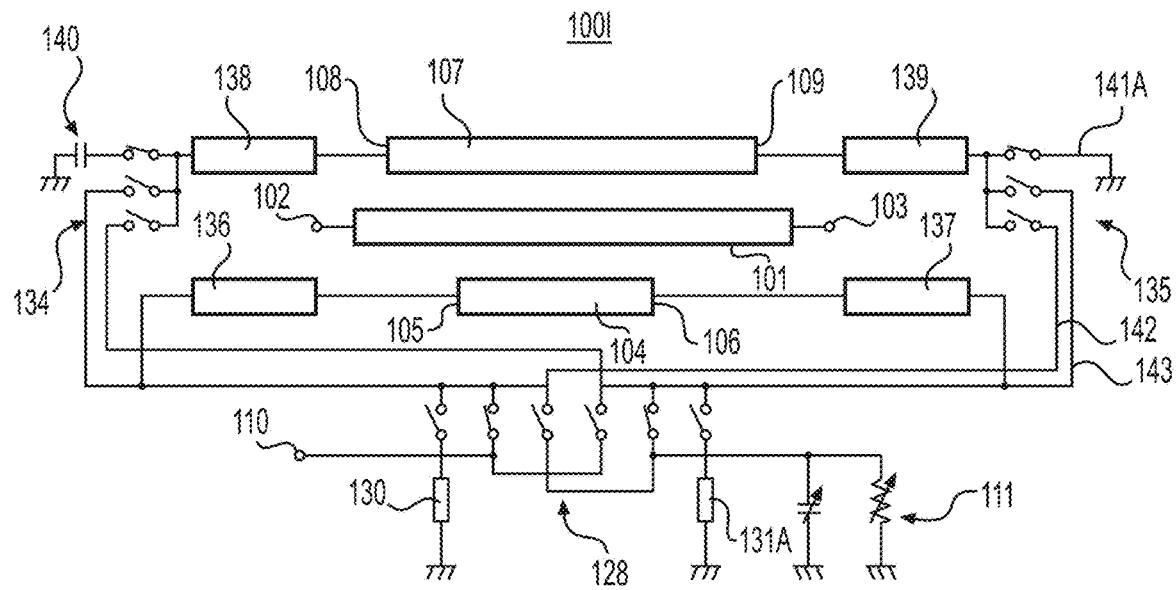
FIG. 16A shows a circuit diagram of a directional coupler according to a tenth preferred embodiment of the present invention.
Figure 16B:
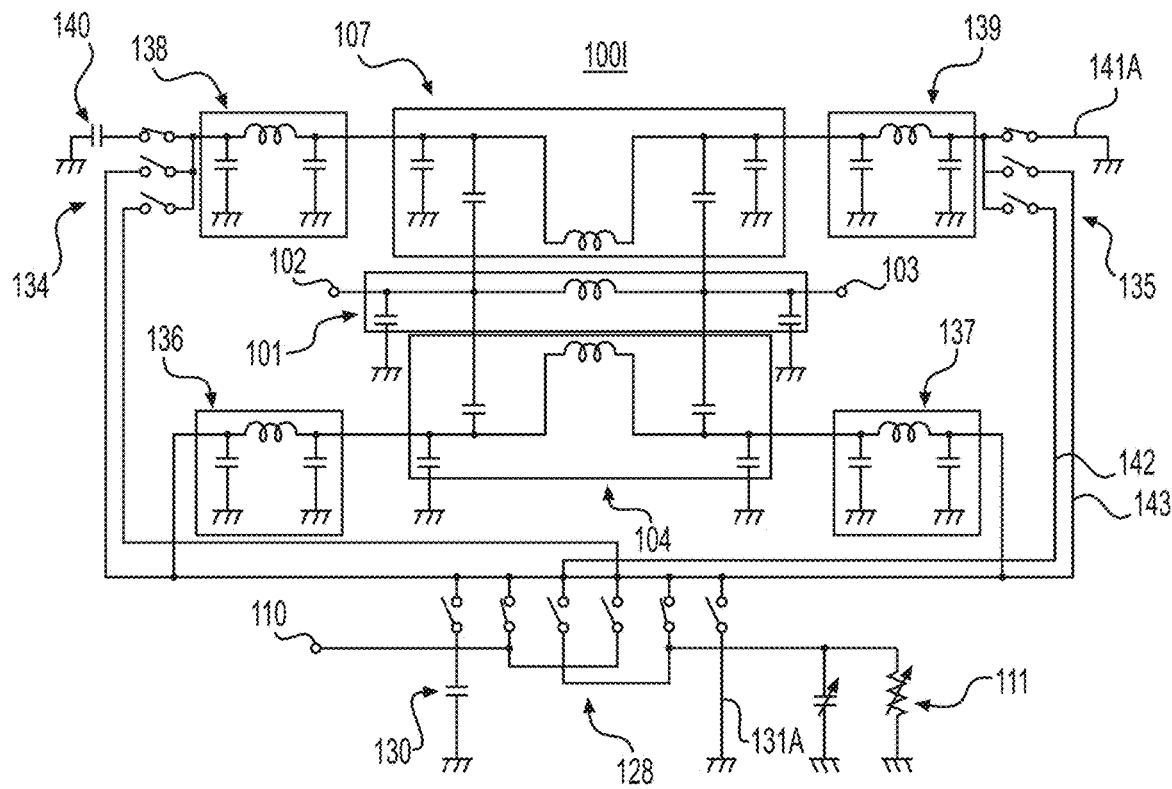
FIG. 16B shows an equivalent circuit thereof.

FIG. 16A shows a circuit diagram of a directional coupler 100I according to a tenth preferred embodiment of the present invention, and FIG. 16B shows an equivalent circuit thereof. In FIGS. 16A and 16B, the same or corresponding elements and portions as those of the previously described preferred embodiments are denoted by the same reference characters, and descriptions thereof are omitted.

The directional coupler 100I shown in FIGS. 16A and 16B is substantially the same as the directional coupler 100H shown in FIG. 14, except that the electrical length adjustment loading element 141A is defined by a wiring line connected directly to ground, instead of a capacitor connected to ground, and the electrical length adjustment loading element 131A is defined by a wiring line connected directly to ground, instead of a capacitor connected to ground.

By enabling one end of the second sub-line 107 to be short-circuited to ground via the electrical length adjustment loading element 141A, it is possible to reduce the resonance frequency by about half when both of the electrical length adjustment loading circuits 140 and 141A are opened, i.e., disconnected. With the configuration of the directional coupler 100I, even without providing an additional short-circuit portion, the electrical length adjustment loading circuits 140 and 141A and the second and third switch circuits 134 and 135 are able to improve isolation from the first switch circuit 128. It is also possible to reduce the resonance frequency by grounding via an inductor, instead of a capacitor. Further, an inductor can be used in addition to a capacitor, for example.

Eleventh Preferred Embodiment

Figure 17:
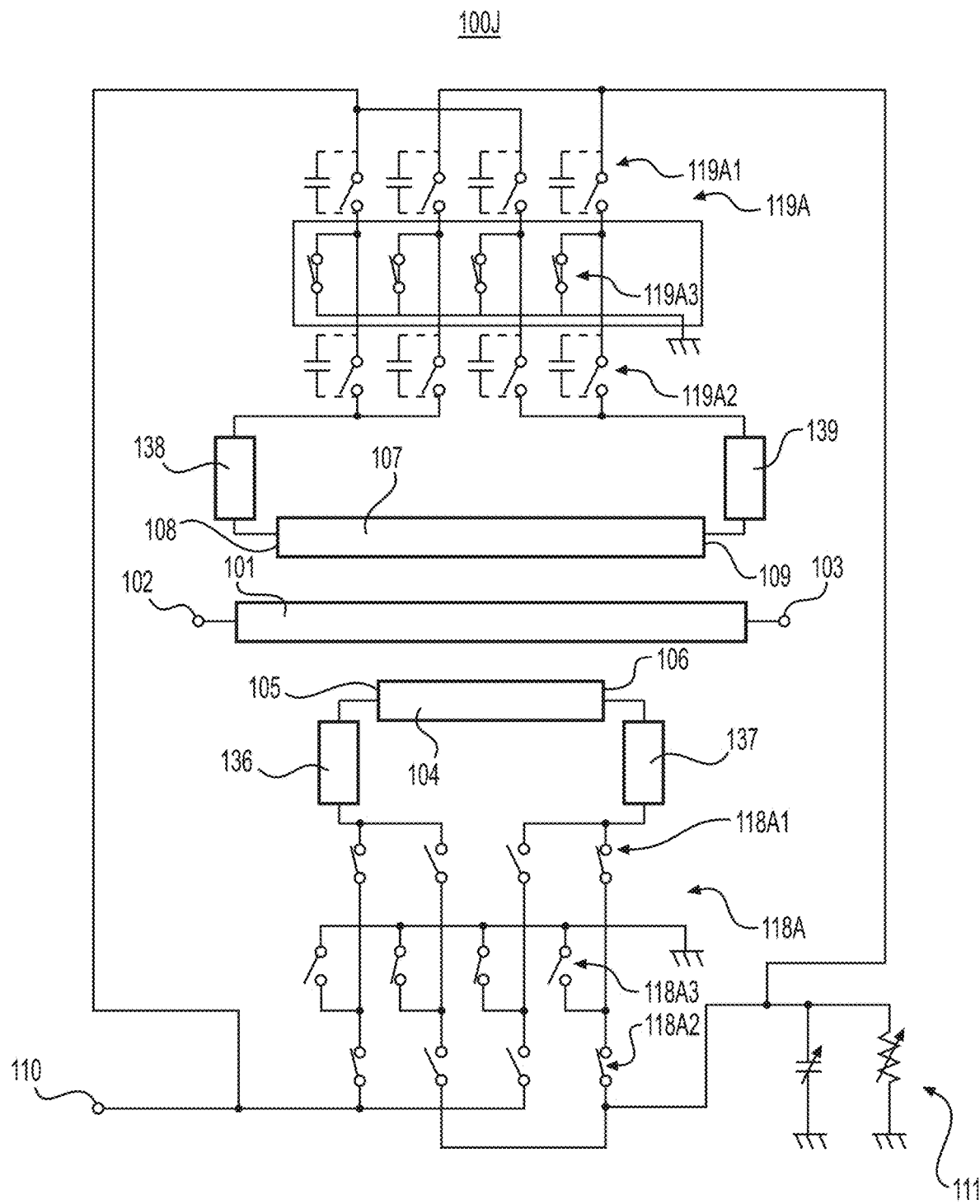
FIG. 17 shows a circuit diagram of a directional coupler according to an eleventh preferred embodiment of the present invention.

FIG. 17 shows a circuit diagram of a directional coupler 100J according to an eleventh preferred embodiment of the present invention. In FIG. 17, the same or corresponding elements and portions as those of the previously described preferred embodiments are denoted by the same reference characters, and descriptions thereof are omitted. Similar to the fourth preferred embodiment shown in FIG. 9, the directional coupler 100J of the present preferred embodiment includes a first switch circuit 118A and a second switch circuit 119A. Each of the first and second switch circuits 118A and 119A can be, for example, a DPDT switch. However, other suitable types of switches may be used, as appropriate.

The first switch circuit 118A can include, for example, series switches 118A1 and 118A2 connected in series and a shunt switch 118A3 connected between the series switches 118A1 and 118A2 and ground. Similarly, the second switch circuit 119A can include, for example, series switches 119A1 and 119A2 connected in series and a shunt switch 119A3 connected between the series switches 119A1 and 119A2. Each of the first and second switch circuits 118A and 119A can have, for example, a T-type configuration. However, the first and second switch circuits 118A and 119A may also have an L-type configuration in which only the switches 118A1 and 119A1 or only the switches 118A2 and 119A2 are provided.

The series switches 118A1, 118A2, 119A1, and 119A2 define both directivity switches and sub-line switches that both (1) selectively connect or disconnect one of the first and second sub-lines 104 and 107 to the common output port 110 and the termination circuit 111, and (2) set the direction in which signals flow through the selected one of the first and second sub-lines 104 and 107. When the series switches 118A1, 118A2, 119A1, and 119A2 are not connected to a respective sub-line 104 or 107 ("open" or "off" state) and the shunt switch 118A3 or 119A3 connects the respective sub-line 104 or 107 to ground ("closed" or "on" state), isolation characteristics of the directional coupler 100J are improved. Some amount of signal from the unused sub-line 104 or 107 might be transferred to the common output port 110 when the series switches 118A1, 118A2, 119A1, and 119A2 are in an open state because the series switches 118A1, 118A2, 119A1, and 119A2 in the open state define and function as capacitors. However, when the series switches 118A1, 118A2, 119A1, and 119A2 are in the open state and the shunt switches 118A3 and 119A3 are in the on state, the signal is transferred to ground. As a result, a signal from the unused sub-line 104 or 107 is not transferred to the common output port 110, and the isolation characteristics between the first and second sub-lines 104 and 107 are improved.

Alternatively, when the series switches 118A1, 118A2, 119A1, and 119A2 are in an off state and the shunt switches 118A3 and 119A3 are in an off state, an increase of insertion loss is reduced or prevented. When the series switches 118A1, 118A2, 119A1, and 119A2 and the shunt switches 118A3 and 119A3 are in an open state, the impedance is increased. As a result, it is difficult for a signal from the main line 101 to be transferred to the unused sub-line 104 or 107, such that an increase of insertion loss is reduced or prevented in the directional coupler 100J including the two sub-lines 104 and 107.

Due to the configuration of the series switches 118A1, 118A2, 119A1, and 119A2 and the shunt switches 118A3 and 119A3, the unused sub-line 104 or 107 defines and functions as a band elimination filter in a similar manner to the unused sub-line 104 or 107 in the directional coupler 100G according to the eighth preferred embodiment shown in FIG. 13. More specifically, with the configuration of the directional coupler 100J shown in FIG. 17, it is possible to attenuate unnecessary waves of a higher order frequency band that is several times greater than the signal frequency band to be passed through the main line 101. Further, it is also possible the adjust the center frequency of the band elimination filter defined by the unused sub-line 104 or 107 by turning off the series switches 118A1 and 118A2 (or 119A1 and 119A2), and turning on the shunt switch 118A3 (or 119A3). As a result of turning off the series switches 118A1 and 118A2 (or 119A1 and 119A2), an off capacitance is generated such that the unused sub-line 104 or 107 defines and functions as a band elimination filter.

Twelfth Preferred Embodiment

Figure 20:
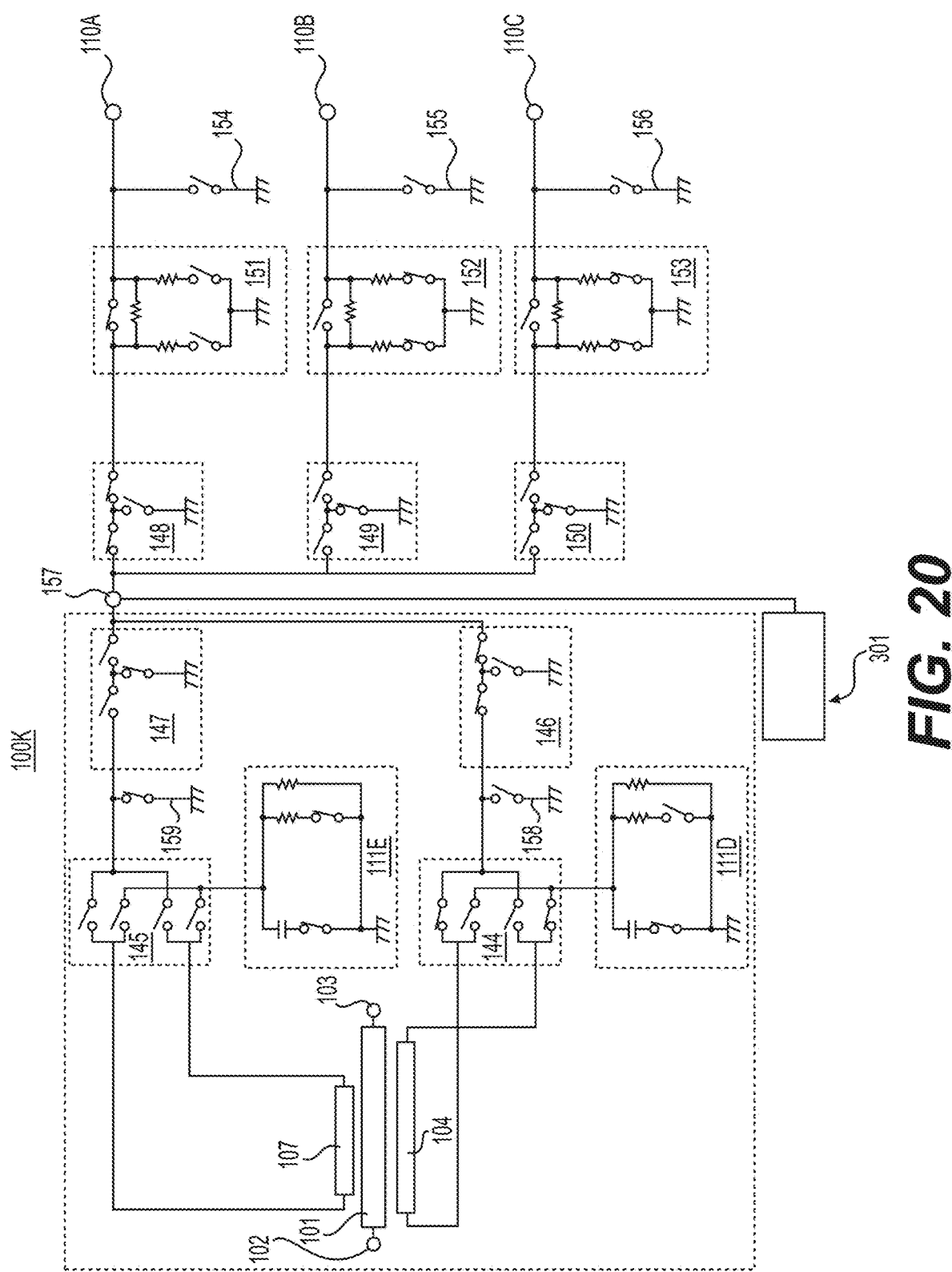
FIG. 20 shows a circuit diagram of a directional coupler according to a twelfth preferred embodiment of the present invention.

FIG. 20 shows a circuit diagram of a directional coupler 100K according to a twelfth preferred embodiment of the present invention. In FIG. 20, the same or corresponding elements and portions as those of the previously described preferred embodiments are denoted by the same reference characters, and descriptions thereof are omitted.

The directional coupler 100K according to the present preferred embodiment includes a first directivity switch circuit 144 to select the direction in which signals are transmitted in the first sub-line 104, a first sub-line switch circuit 146 to selectively connect or disconnect the first sub-line 104 to an node 157 and a first termination circuit 111D, a second directivity switch circuit 145 to select the direction in which signals are transmitted in the second sub-line 107, a second sub-line switch circuit 147 to selectively connect or disconnect the second sub-line 107 to the node 157 and a second termination circuit 111E.

Each of the first and second sub-line switch circuits 146 and 147 can be a T-type switch including two series switches connected in series and a shunt switch connected between the two series switches and ground. Alternatively, the first and second sub-line switch circuits may be L-type switches, or other suitable types of switches. The first and second sub-line switch circuits 146 and 147 may be the same type of switch or may be different types of switches.

The directional coupler 100K further includes a first isolation characteristic improvement switch circuit 158 configured to improve the isolation characteristics of the first sub-line 104 from the main line 101 when not in use, and a second isolation characteristic improvement switch circuit 159 configured to improve the isolation characteristics of the second sub-line 107 from the main line 101 when not in use. Each of the first and second isolation characteristic improvement switch circuits 158 and 159 can be a shunt switch. However, other suitable types of switches may be used as long as they provide isolation characteristic improvement.

Another directional coupler 301 that is the same as or similar to the directional coupler 100K may be connected to the node 157. Such a device including two directional couplers 100K and 301 can be used for carrier aggregation with more than one transmission power. A common detection circuit can be connected to the two directional couplers 100K and 301, and the output signals (e.g., the detection signals) from the two directional couplers 100K and 301 are alternately detected by the common detection circuit.

In contrast to the directional couplers according to the above-described preferred embodiments, the directional coupler 100K according to the present preferred embodiment includes a plurality of common output portions 110A, 110B, and 110C that are selectively connected to the node 157 by common output port selection switch circuits 148, 149, and 150, respectively. Each of the common output port selection switch circuits 148, 149, and 150 can be, for example, a T-type switch including two series switches connected in series and a shunt switch connected between the two series switches and ground. Alternatively, the common output port selection switch circuits 148, 149, and 150 may be L-type switches, or other suitable types of switches. The common output port selection switch circuits 148, 149, and 150 may be the same type of switches or may be different types of switches.

Variable attenuators 151, 152, and 153 and ESD protection switches 154, 155, and 156 are connected between a respective one of the common output port selection switch circuits 148, 149, and 150 and a respective one of the common output ports 110A, 110B, and 110C.

With the configuration of the directional coupler 100K according to the present preferred embodiment, by switching the sub-line between the first sub-line 104 and the second sub-line 107 and the coupling degree between the first and second sub-lines 104 and 107 and the main line 101 using the directivity switch circuits 144 and 145, the switch isolation characteristic improvement switch circuits 158 and 159, and the sub-line switches 146 and 147, it is possible to control the desired signal in a wide frequency range. By being able to share one main line 101 with a signal in a wide frequency range, it is also possible to use such a signal for different communication methods, for example, 2G, 3G, 4G, or 5G communication methods or wireless LAN communication methods.

By providing the ESD protection switch circuits 151, 152, and 153, an excessive voltage is prevented from flowing to the common output ports 110A, 110B, 110C, and such excessive voltage flows to ground to prevent damage to the main portion of the directional coupler 100K or to a circuit connected thereto.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A directional coupler comprising:
   a main line through which a signal is transmitted;
   at least two sub-lines that are selectively coupled to the main line;
   a common output port that outputs a detection signal generated by the signal transmitted through the main line;
   a termination circuit; and
   at least one switch circuit that:
      selectively connects one of the at least two sub-lines to the common output port and the termination circuit;
      selectively disconnects another one of the at least two sub-lines from the common output port and the termination circuit; and
      selectively connects one end of the one of the at least two sub-lines to one of the common output port and the termination circuit and another end of the one of the at least two sub-lines to another one of the termination circuit and the common output port; wherein
   a degree of coupling between the main line and one of the at least two sub-lines is different from a degree of coupling between the main line and another one of the at least two sub-lines;
   the at least one switch circuit includes first and second switch circuits;
   the first switch circuit selectively connects the one end of the one of the at least two sub-lines to the one of the common output port and the termination circuit and the another end of the one of the at least two sub-lines to the another one of the termination circuit and the common output port; and
   the second switch circuit selectively connects the one of the at least two sub-lines to the common output port and the termination circuit and disconnects the another one of the at least one sub-lines from the common output port and the termination circuit.

2. The directional coupler according to claim 1, wherein the at least two sub-lines have one or more of different sizes, different distances from the main line, or different lengths.

3. The directional coupler according to claim 1, wherein the first and second switch circuits are defined by a common switch circuit.

4. The directional coupler according to claim 1, wherein the first and second switch circuits are separate switch circuits.

5. The directional coupler according to claim 1, further comprising a shunt switch between the first and second switch circuits and connected to ground.

6. The directional coupler according to claim 1, wherein at least one of the first and second switch circuits is provided separately for each of the first and second sub-lines.

7. A directional coupler comprising:
   a main line through which a signal is transmitted;
   at least two sub-lines that are selectively coupled to the main line;
   a common output port that outputs a detection signal generated by the signal transmitted through the main line;
   a termination circuit; and
   at least one switch circuit that:
      selectively connects one of the at least two sub-lines to the common output port and the termination circuit;
      selectively disconnects another one of the at least two sub-lines from the common output port and the termination circuit; and
      selectively connects one end of the one of the at least two sub-lines to one of the common output port and the termination circuit and another end of the one of the at least two sub-lines to another one of the termination circuit and the common output port; wherein
   a degree of coupling between the main line and one of the at least two sub-lines is different from a degree of coupling between the main line and another one of the at least two sub-lines; and
   the at least one switch circuit includes:
      a series switch connected between at least one of the at least two sub-lines and the common output port; and
      a shunt switch connected between the at least one of the at least two sub-lines and ground.

8. The directional coupler according to claim 7, wherein the shunt switch is connected between the at least one of the at least two sub-lines and the common output terminal and is connected to ground; and
   the shunt switch is open to define an electrostatic discharge device.

9. The directional coupler according to claim 7, wherein the termination circuit includes at least two termination circuits that are provided separately for the at least two sub-lines.

10. The directional coupler according to claim 7, wherein the at least two sub-lines have one or more of different sizes, different distances from the main line, or different lengths.

11. The directional coupler according to claim 7, wherein the termination circuit is a variable termination circuit.

12. The directional coupler according to claim 7, further comprising
   a variable matching circuit between at least one of the at least two sub-lines and the common output port; and
   a variable attenuator between the at least one of the at least two sub-lines and the common output port.

13. A directional coupler comprising:
a main line through which a signal is transmitted;
at least two sub-lines that are selectively coupled to the main line;
a common output port that outputs a detection signal generated by the signal transmitted through the main line;
a termination circuit; and
at least one switch circuit that:
  selectively connects one of the at least two sub-lines to the common output port and the termination circuit;
  selectively disconnects another one of the at least two sub-lines from the common output port and the termination circuit; and
  selectively connects one end of the one of the at least two sub-lines to one of the common output port and the termination circuit and another end of the one of the at least two sub-lines to another one of the termination circuit and the common output port; and
first and second electrical length adjustment loading circuits; wherein
a degree of coupling between the main line and one of the at least two sub-lines is different from a degree of coupling between the main line and another one of the at least two sub-lines;
the at least one switch circuit includes first, second, third switch circuits; and
the third switch circuit selectively connects and disconnects the first and second electrical length adjustment loading circuits to the another one of the at least two sub-lines that is disconnected from the common output port and the termination circuit.

14. The directional coupler according to claim 13, wherein at least one of the first and second electrical length adjustment loading circuits includes a capacitor connected in series between the third switch circuit and ground.

15. The directional coupler according to claim 13, wherein
the first switch circuit selectively connects the one end of the one of the at least two sub-lines to the one of the common output port and the termination circuit and the another end of the one of the at least two sub-lines to the another one of the termination circuit and the common output port;
the second switch circuit selectively connects the one of the at least two sub-lines to the common output port and the termination circuit and selectively disconnects the another one of the at least one sub-lines from the common output port and the termination circuit;
at least one of the first and second electrical length adjustment loading circuits and the third switch are defined by the first switch circuit;
the first switch circuit includes a series switch provided between at least one of the at least two sub-lines and the common output port, and a shunt switch provided between the at least one of the two sub-lines and ground; and
a capacitance is provided when the series switch which is open.

16. The directional coupler according to claim 13, wherein
the first switch circuit selectively connects the one end of the one of the at least two sub-lines to the one of the common output port and the termination circuit and the another end of the one of the at least two sub-lines to the another one of the termination circuit and the common output port;
the second switch circuit selectively connects the one of the at least two sub-lines to the common output port and the termination circuit and selectively disconnects the another one of the at least one sub-lines to the common output port and the termination circuit;
at least one of the first and second electrical length adjustment loading circuits and the third switch are defined by the second switch circuit;
the second switch circuit includes a series switch provided between at least one of the at least two sub-lines and the common output port, and a shunt switch provided between the at least one of the two sub-lines and ground; and
a capacitance is provided when the series switch which is open.

17. The directional coupler according to claim 13, wherein the at least two sub-lines have one or more of different sizes, different distances from the main line, or different lengths.

* * * * *